United States Patent [19]

Ellis

[11] Patent Number: 5,133,390

[45] Date of Patent: Jul. 28, 1992

[54] TAPE AUTOMATED BONDING FEEDER AND LEAD FORMING APPARATUS

[75] Inventor: J. Gregg Ellis, Indian Harbour Beach, Fla.

[73] Assignee: Microtek Industries, Inc., Melbourne, Fla.

[21] Appl. No.: 616,328

[22] Filed: Nov. 21, 1990

[51] Int. Cl.$^5$ .............................................. B21F 1/00
[52] U.S. Cl. ...................................... 140/105; 29/741
[58] Field of Search .................. 140/105; 29/740, 741, 29/566.3; 221/11, 106, 289, 298

[56] References Cited

U.S. PATENT DOCUMENTS

| | | | |
|---|---|---|---|
| 3,841,293 | 10/1974 | Laporte et al. | 221/289 |
| 4,169,541 | 10/1979 | Ragard et al. | 221/298 |
| 4,704,792 | 11/1987 | Itagaki et al. | 29/741 |
| 4,819,699 | 4/1989 | Brown et al. | 140/105 |
| 4,941,248 | 7/1990 | Seidel et al. | 140/105 |
| 4,957,146 | 9/1990 | Satterfield et al. | 140/105 |
| 4,965,927 | 10/1990 | Holzman | 29/740 |

*Primary Examiner*—Lowell A. Larson
*Attorney, Agent, or Firm*—Evenson, Wands, Edwards, Lenahan & McKeown

[57] ABSTRACT

An tape automated bonding feeder apparatus employs a vertical carrier extraction unit to successively supply electronic circuit components to an output station from which a component is seized for placement and attachment to a circuit board. The feeder apparatus, which may be mounted on a rollable cart, includes a generally rectilinear housing on a top plate of which one or more magazines are mounted. A magazine contains a stack of circuit component carriers. The bottom of the magazine has a carrier extraction unit which controllably allows an individual component carrier at the bottom of the stack to drop away onto an underlying carrier shuttle. The carrier shuttle is supported for movement between the magazine and a lead forming unit. The lead forming unit detaches a component from the carrier and forms the leads of the excised component for mounting the component to a circuit board. A processed component transport unit is coupled to an anvil of the lead forming unit and transports a processed component to the output station.

26 Claims, 17 Drawing Sheets

SHUTTLE STOPPED AT DIE
PRESS STATION 31
ABOVE ANVIL 41

GRIPPER LOWERED TO BRING
CARRIER ONTO ANVIL

PRESS LOWERS UPPER
PLATEN TO BRING LEAD
FORMING UNIT 39 ONTO
ANVIL 41

TAPE AUTOMATED BONDING FEEDER AND LEAD FORMING APPARATUS

FIELD OF THE INVENTION

The present invention relates in general to the assembly of electronic printed circuit boards and is particularly directed to an apparatus for excising individual circuit components from tape automated bonding (TAB) carriers, forming the leads of the excised components and delivering the processed components to a presentation station for pick and place transport by an associated part seizure system, such as a robotic pick and place system.

BACKGROUND OF THE INVENTION

As continuing refinements in micro-miniaturization techniques have increased the component occupancy densities of printed circuit boards, misalignment and imprecise shaping or formation of component leads have become significant concerns of system manufacturers, particularly those employing surface mount devices such as narrow pitch leaded chip carriers. Circuit components having high count, very narrow pitch leads are often processed using a tape automated bonding scheme, in which the part (the electronic circuit component) to be mounted on a circuit board is temporarily retained in a surrounding support frame or carrier. The extremely thin and narrow pitch leads of the part extend between the part and the frame and support tape is similarly employed to retain the part in the carrier during handling.

Because the retention carrier is relatively thin compared to its edgewise dimensions, it is customary to arrange a plurality of carriers in a stacked configuration. Individual carriers to be processed are separated off the top of the stack in a sideways direction, similar to dealing cards from the bottom of the deck. A separated carrier is then placed on a lead forming device, so that the part may be detached or excised from the carrier and the leads formed and trimmed for placement and attachment to a printed circuit board.

A fundamental problem to horizontal translation of a carrier from the top of the stack is the fact that the carrier surfaces are not perfectly smooth, so that the lowermost carrier may hang up on the next carrier, thereby hindering the feed and lead formation process. In addition, because 'dealing' a carrier off the bottom of the stack involves horizontal or sideways movement (in a direction orthogonal to that of the stack) the feed mechanism requires a considerable hardware volume.

SUMMARY OF THE INVENTION

In accordance with the present invention, the above problems of conventional TAB feeder systems are obviated by a new and improved reduced hardware volume apparatus which successively feeds individual ones of a plurality of carrier-retained electronic circuit components to a pick and place device for placement and attachment to a circuit board without having to sideways translate the carriers of the stack, thereby preventing surface anomalies on the surfaces of adjacent carriers in the stack from impeding the feed process. (As used in the present specification, a TAB carrier implies a carrier employed in a tape automated bonding system or any similar type system, such as a tape pack.)

For this purpose the present invention employs a compact, substantially rectilinear housing on a top plate of which at least one carrier magazine is mounted. In a single magazine configuration, only one magazine is affixed to the top plate of the housing directly above a carrier extraction or delivery opening. In a multiple magazine configuration, a plurality of magazines are arranged side by side on a horizontally translatable support plate, which permits a selected magazine to be controllably positioned over the carrier delivery opening in the top plate of the housing.

A magazine stores a plurality of circuit component carriers in a vertical, stacked configuration. The bottom of the magazine contains a carrier extraction unit which controllably allows the bottom-most carrier to drop away from the stack, while retaining the remaining carriers within the magazine. The dropped carrier falls onto a carrier shuttle, which is supported on a transport rail for movement between the magazine and a lead forming unit that is spaced apart from the magazine in the vicinity of a part presentation station.

The lead forming unit includes a vertically translatable die press and a horizontally transportable anvil. When the carrier shuttle transports the carrier to the lead forming unit and places the carrier on the anvil, the die press is lowered onto the anvil in order to detach the part from its carrier and form the leads of the excised part into a gull-wing shape for surface-mounting the part onto a circuit board. The anvil is supported on its own transport block which rides on the transport rail and transports the processed part to the presentation station.

The carrier shuttle is configured to retain a captured carrier in a generally horizontal orientation. The carrier extraction unit includes a shutter mechanism which controllably opens to allow the lowermost component carrier within the magazine to drop to the shuttle. It also includes an adjacent carrier-engaging unit which retains the next lowermost carrier in place as the lowermost carrier in the magazine is allowed to drop away through the open shutter. After the lowermost or bottom carrier has dropped away from the stack, the carrier extraction unit allows the next lowermost carrier to move into position as the lowermost carrier within the magazine.

The carrier extraction unit's shutter mechanism has a variable size aperture which, in a first degree of opening, is of a size less than that of an individual carrier, so as to effectively prevent a carrier which is adjacent to the aperture from passing through it. In a second degree of opening, the aperture is of a size sufficient to allow a carrier adjacent to the aperture to pass through the aperture and onto the carrier shuttle. The carrier extraction unit further includes a plunger device, which is coupled with the shutter mechanism and is arranged to engage the next lowermost carrier when the shutter mechanism is operated to bring the aperture to its second degree of opening.

The variable size aperture of the shutter mechanism is formed by means of pair of relatively translatable frames. A first of these frames is affixed to the bottom of the magazine. The fixed frame has a first window sufficient to accommodate the second degree of opening A second, translatable frame slides along the top of the fixed frame and has a second window sufficient to accommodate the second degree of opening for a first mutually overlapping position of the translatable frame with the fixed frame. A pair of springs normally bias the translatable frame to a second mutually overlapping position with the fixed frame, so that said first and second windows have a mutual overlap associated with the first degree of opening and thereby prevent a carrier from passing through the aperture.

The shutter mechanism further includes a pair of cam members, which are rotatable about respective axes passing through the fixed frame and are coupled with the translatable frame such that, for the second mutually overlapping position of the translatable frame relative to the fixed frame, the cam members are rotated to positions within the first degree of opening of the aperture and, for the first mutually overlapping position of the translatable frame relative to the fixed frame, the cam members are rotated to positions out of the second degree of opening of the shutter The cam members are sized to lie substantially within a thickness dimension of the translatable frame, so as to provide carrier support along one edge while an edge of the translatable frame provides carrier support along another edge of the carrier.

The plunger device is mounted to the translatable frame and includes a plunger element, the nose of which is positioned and sized to engage a sidewall of the next lowermost carrier as the translatable frame is moved from its second mutually overlapping position to its first mutually overlapping position with the fixed frame. As a result, during movement of the translatable frame from its second mutually overlapping position to its first mutually overlapping position with the fixed frame, the plunger element frictionally abuts against a sidewall of the next lowermost carrier in the magazine and causes that carrier to be supported at its opposite sidewalls between an interior wall of the magazine and the plunger element.

The carrier shuttle onto which the bottom carrier in the magazine is dropped by the operation of the carrier extraction unit includes a gripper mechanism having first and second gripper fingers which serve to retain the dropped carrier in a horizontal orientation. The gripper fingers are controllably translatable toward and away from each other in a horizontal direction, with each finger having a ledge upon which a dropped carrier is supported along its edges, and an overhang 'roof' plate that partially overlaps the ledge.

The gripper fingers are held by a gripper finger support which retains the gripper fingers in spaced-apart relationship such that the gripper fingers are urged together by bias springs toward a minimum separation distance therebetween. It also includes a controllable finger spreading element which controllably increases the separation between the gripper fingers to allow for capture of a carrier dropped from the magazine, on the one hand, and for discarding a spent carrier, on the other hand. The gripper finger support comprises a base support portion and first and second finger retention elements extending in spaced-apart relationship. Shaft members are supported by the finger retention elements and pass through the gripper fingers, so that the gripper fingers are horizontally, translationally supported by the shaft elements.

The gripper finger support further includes a pneumatic rod arranged parallel to the shaft elements. The axial bore in the rod is ported to a controlled air supply and opposite ends of the rod are coupled to respective bores in the gripper fingers to controllably apply a pneumatic spreading force against the bias springs. The gripper fingers are further configured to engage a mechanical spreading element located beneath the top plate of the feeder at the magazine, such that when the shuttle is brought to the magazine, engagement with this mechanical spreading element will increase the separation between the gripper fingers against the normal together-urging retention of the gripper fingers by the gripper finger support.

A shuttle base is mounted to a block which rides on the transport rail. A vertical displacement unit comprises an arrangement of translation column members that are supported by the shuttle base and support the gripper mechanism for vertical translational movement relative to the shuttle base.

When the carrier shuttle is translated along the rail to the lead forming station, the gripper finger support is lowered onto the anvil such that alignment pins on the anvil engage carrier registration holes in the carrier. The die press unit is then operated to bring a lead forming die into controllable engagement with the anvil, thereby excising the part from the carrier and forming the leads of the excised part. The lead forming die is rigidly affixed to a translatable die support member, and the force exerted by the die upon leads of the part is externally controllable, so as to assure precise lead formation. The anvil includes an ejector element which is controllably urged into contact with a formed part that has been excised from the carrier, so as to lift the part off the anvil and facilitate vertical access to and capture by a part seizure device (robot end effector).

The feeder itself may be mounted to a transport cart which includes a base frame supported for rolling movement upon a floor surface. A support frame is mounted on the base frame, and includes a height adjustment mechanism for adjusting the height of the feeder. A mounting plate is affixed to an upper end of the height adjustment mechanism, so as to provide a support base for the feeder. A spent carrier discard bin is supported by the support frame beneath the location of the feeder where support carriers are discarded. A pair of alignment elements are affixed to the mounting plate, and are arranged to engage associated alignment members on an adjacent circuit board assembly unit.

In the course of the assembly of a printed circuit board, as by way of a host-directed robotic pick and place system, a plurality of TAB feeders may be arranged together, with the host machine supervising the operations of each component feed unit. Each component feed unit includes its own local programmable logic controller unit having interfaces for sensor, drive and signalling elements of that unit. To facilitate communications between the host machine and the respective feeders, the present invention employs a distributed multiplex signalling bus to which the attendant controllers of the plurality of component feed units are coupled and through which multiple feed units are selectively addressed by the host machine in the course of accessing components for placement and attachment to a circuit board.

In accordance with a further embodiment, the feeder may support a plurality of magazines, in each of which a plurality of circuit component carriers are arranged in a stacked configuration, translatably mounted with respect to the extraction aperture in the feeder housing. As in the single magazine embodiment, each magazine has a carrier extraction unit at its base which controllably allows an individual component carrier to drop away from the stack, when that magazine is aligned over the extraction aperture.

DETAILED DESCRIPTION

Figure 1:
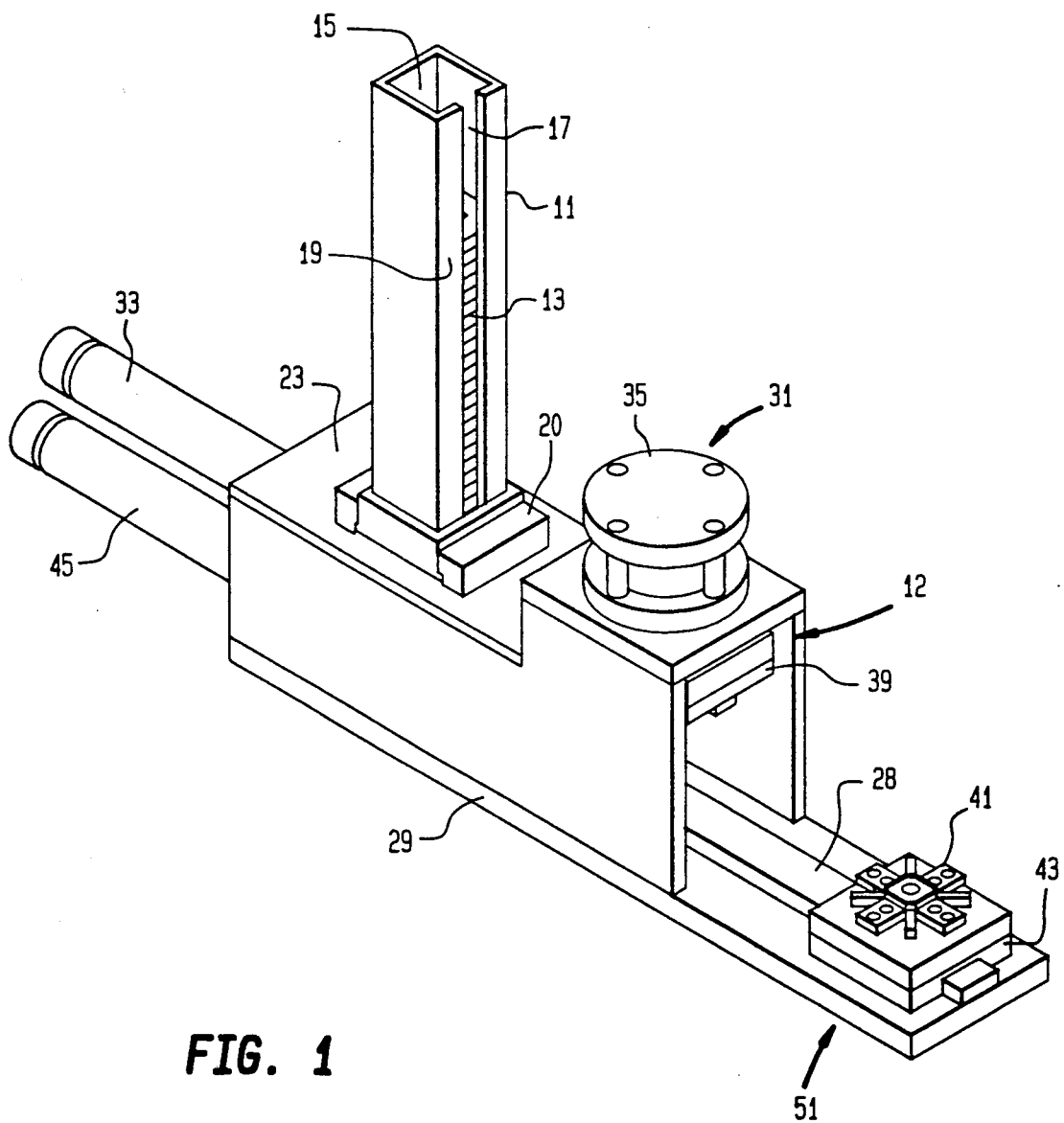
FIGS. 1, 2 and 3 show respective isometric, side and top diagrammatic views of a first embodiment of a tape automated bonding (TAB) feeder apparatus of the present invention.
Figure 3:
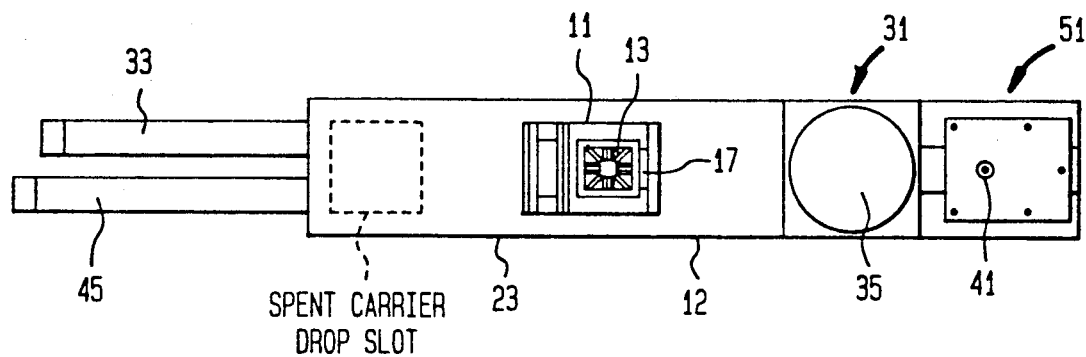
Figure 2:
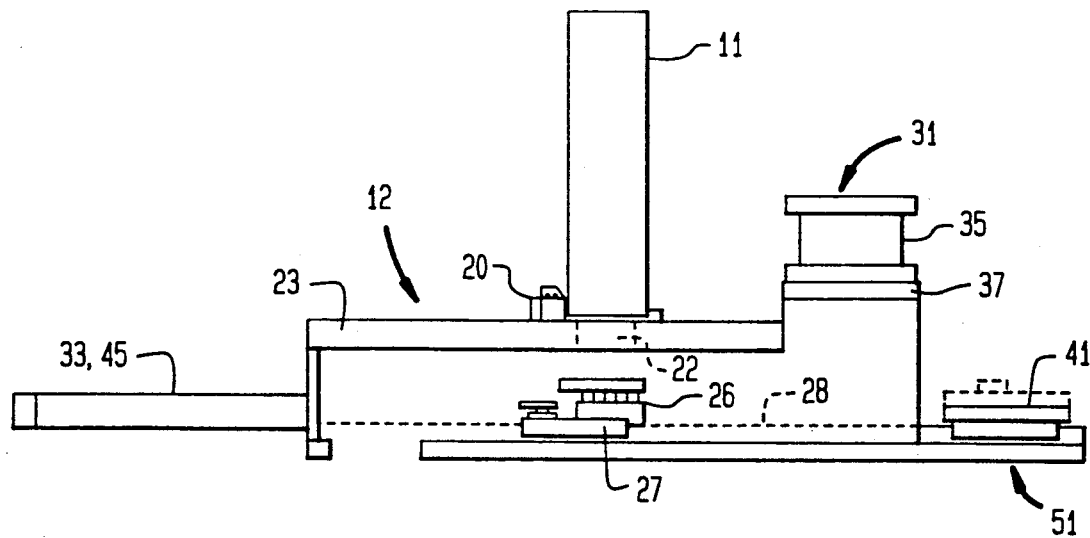

FIGS. 1, 2 and 3 show respective isometric, side and top diagrammatic views of a first embodiment of a tape automated bonding (TAB) feeder apparatus of the present invention as comprising a housing 10 upon which a single, vertically configured, TAB carrier magazine 11 is removably mounted. In the diagrammatic isometric illustration of FIG. 1, the magazine is Magazine 11 stores a plurality of TAB-based circuit component carriers 13, that have been inserted through a topside opening 15, so as to form a 'coin stack' arrangement 18 of carriers. The stacked carriers are visible and physically accessible by means of a vertical window 17 in an endwall 19 of the magazine. The carrier magazine 11 is removably mounted to housing 10 by way of a base bracket 20 directly above an aperture 22 in a top plate 23. Aperture 22 is sized slightly larger than an individual carrier, so as to permit a carrier to drop from the bottom of the stack 18 within the magazine onto a carrier shuttle 26, shown in the side view of FIG. 2. Carrier shuttle 26 is mounted atop a block 27 that rides along a support rail 28 mounted to a bottom plate 29 of the housing, so that carrier shuttle 26 may be controllably translated between the magazine 11 and a die press station 31.

As will be described in detail below, a carrier extraction unit 12 at the base of magazine 11 controllably singulates an individual component carrier from the bottom of the stack 18 through the aperture 22 in the top plate onto the shuttle. By 'singulate' is meant the delivery or extraction of a single or individual part from the stack onto the shuttle. The translatable block 27 to which the carrier shuttle is mounted is driven along support rail 28 by the output shaft (push rod) of a control air cylinder 33, thereby translating the carrier shuttle back and forth between magazine station 14 and die press station 31.

At die press station 31, a die press 35 is mounted to an upper top plate 37 of the housing, and supports a vertically translatable lead-clamping, excising and forming unit 39, which is arranged to engage a horizontally translatable anvil 41, when the anvil is positioned directly beneath the press. Anvil 41, like shuttle carrier 26, is mounted to a block 43, which is controllably translated by means of an associated control air cylinder 45 along support rail 28 between die press station 31 and a part presentation station 51 at the right end of base plate 29, as viewed in the Figures.

When anvil 41 is located beneath the die press 35 at the die press station 31, it is in position to receive a carrier that has been delivered to it by the translation of the carrier shuttle from the magazine station to the die press station. The die press is then translated vertically downward onto the anvil, so as to excise the part from the carrier and form the leads of the severed part. The shuttle then lifts the spent carrier off the anvil and is translated back to the magazine station. Simultaneously, the anvil 41 and the formed part are translated to the presentation station 51, so that the formed part may be seized vertically by a pick-up device, such as a robot end-effector, and mounted to a printed circuit board.

Before describing the structural details of the individual components of the feeding system of FIG. 1, the overall arrangement and operation of the system will be described with reference to the side view illustrations of FIGS. 4-11, which show respective locations of the components of the system (including a programmable logic controller unit 100 through which the operations of the system are controlled under the direction of a host controller) for the sequential steps of one complete cycle of the system. Programmable logic controller unit 100 is preferably contained within a housing mounted adjacent to housing 10, which also includes electrical and pneumatic interfaces (e.g. solenoid valves) for the respective sensor, drive and signalling elements of the system as will be described below. Control communications between each TAB feeder and its associated host controller are preferably carried out by way of a distributed multiplex signalling bus to which one or more feeders are coupled so as to permit multiple feeders to be selectively addressed by means of a single cable set from the host machine. Each feeder unit preferably has a presettable thumbwheel switch through which its address may be prescribed, to facilitate varying on-line participation of each feeder in a circuit board manufacturing system. Rather than detail the control program through which the host directs the operation of a TAB feeder cycle, the following discussion will set forth the sequence of operations of a carrier cycle. For details of the control program itself, attention may be directed to the accompanying Appendix.

Figure 4:
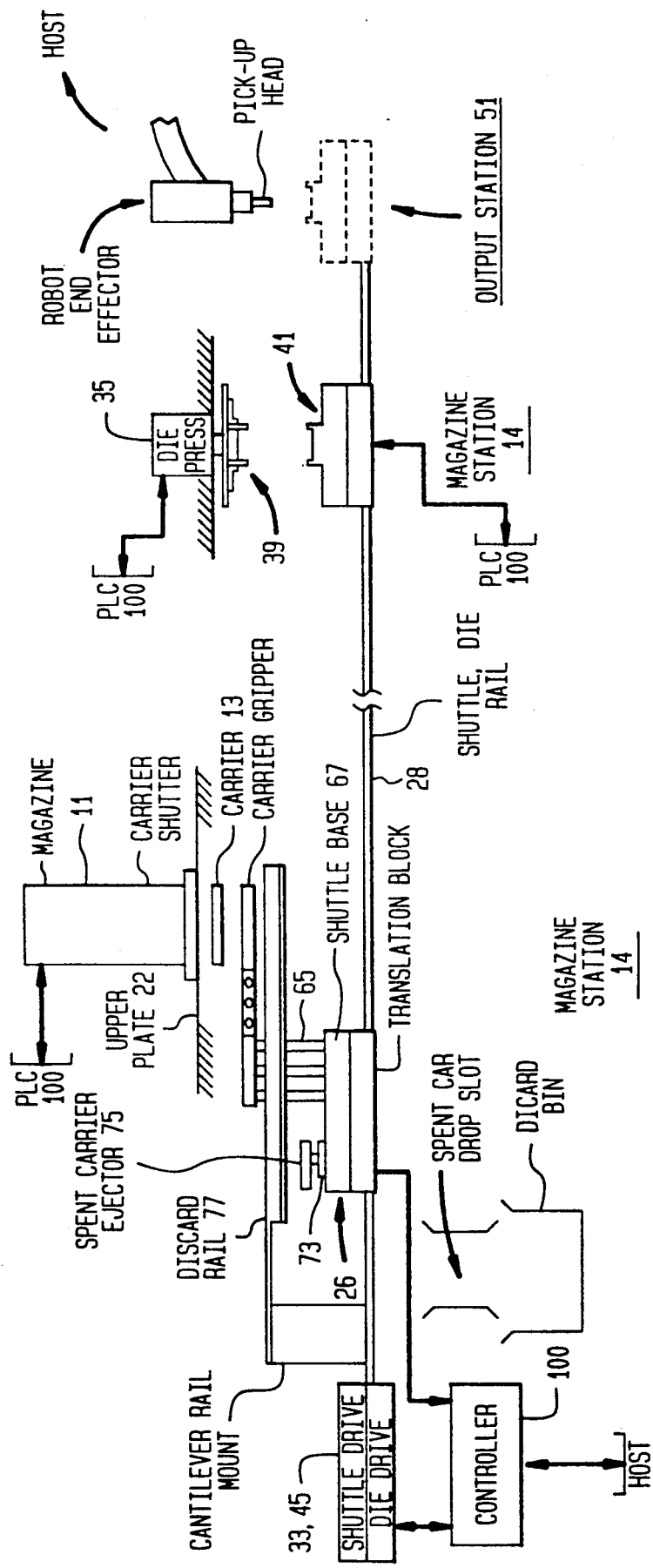
FIGS. 4-11 are diagrammatic side view illustrations of the individual components of the feeding system of FIGS. 1-3 during respective steps of one cycle of operation.

FIG. 4 diagrammatically illustrates the starting location (magazine station 14) of carrier shuttle 26 directly beneath magazine 11. The shuttle itself includes a set of carrier gripper fingers 61 mounted to a gripper support 63, which is supported and guided on a set of posts 65 for vertical movement with respect to a shuttle base 67. Also mounted to shuttle base 67 is a spent carrier discard device 71 comprised of a spent carrier discard control cylinder 73 and a push plate 75 mounted to the output shaft of cylinder 73. As will be described below, during the shuttle carrier's return to the magazine station 14 from the die press station 31, discard control air cylinder 73 is operated to cause push plate 75 to engage a previously spent carrier (namely one from which a circuit part has been excised at the die press station) that has been discarded onto a set of spent carrier rails 77. Rails 77 are supported in cantilever fashion above the shuttle carrier rail 28 and extend to a location directly beneath the magazine. The horizontal spacing between rails 77 and the separation between the vertical posts 65 of the shuttle 26 are dimensioned so that the spent carrier rails fit between the vertical posts 65 of the shuttle. Consequently, as the shuttle is translated between magazine station 14 and die press station 31, the shuttle posts 65 pass outside the rails without hinderance.

With shuttle 26 initially positioned at its starting location at magazine station 14, its controller 100 looks for its address transmitted from the host controller, indicating that it is to begin a carrier cycle. When the controller sees its address on the communications bus it transmits an acknowledgement (ACK) signal to the host processor, indicating that it is ready to proceed. In response to the acknowledgement signal, the host transmits a START flag, instructing the feeder to execute a carrier cycle. Unless an error is encountered in the carrier extraction and processing sequence to be described below, controller 100 proceeds without further dialogue with the host. If an error is encountered, an ERROR flag is raised by the controller, informing the host of a problem with the feeder, so that a system operator may be advised and corrective action taken. An error flag is generated upon the occurrence of any of the following conditions: 1) if a part has failed to drop onto the shuttle, so that the carrier sensor does not see the carrier in place; 2) if a part has been successfully captured by the shuttle, but not properly delivered to and placed in registration on the anvil; and 3) an attempt is made to start a new feed cycle without seeing an eject flag.

At the beginning of the cycle, carrier extraction unit 12, which is initially positioned at the base of magazine 11, controllably extracts an individual component carrier 13 from the bottom of the stack 18 by permitting the bottom-most carrier to drop away from the stack through aperture 22 in top plate 23 and onto the carrier gripper 61 of the shuttle. As will be described in detail below with reference to FIG. 20-28, carrier gripper 61 has a pair of horizontally adjustable gripper fingers that are configured and adapted to engage a spreading wedge member (not shown in FIG. 4), which is mounted to the bottom of top plate 23 when the shuttle is positioned at magazine station 14. In this position, the spreading wedge member engages the gripper fingers and urges the fingers apart sufficiently to permit a dropped carrier to come to rest upon respective horizontal ledges of the fingers, but not so far apart to permit the carrier to drop past the gripper fingers to the spent carrier rails 77. When the shuttle departs the magazine station, the gripper fingers disengage the spreading wedge member, so that a pair of springs (not shown in FIG. 4) may bias the gripper fingers together and allow a pair of overhang plates (also not shown in FIG. 4) to slightly overhang the peripheral edges of opposite sides of the captured carrier, whereby the gripper retains the carrier in a horizontal orientation during placement on the lower die anvil.

Figure 5:
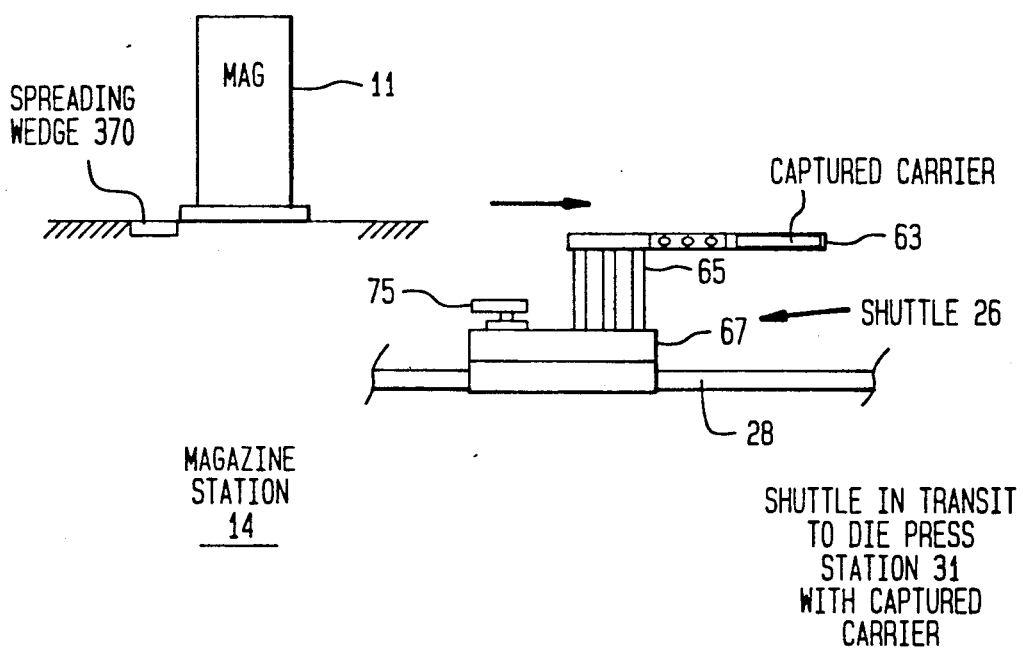
Figure 6:
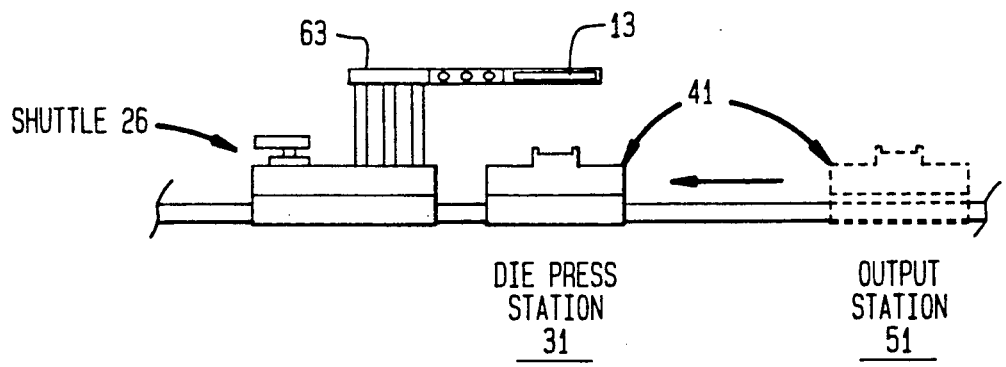
Figure 7:
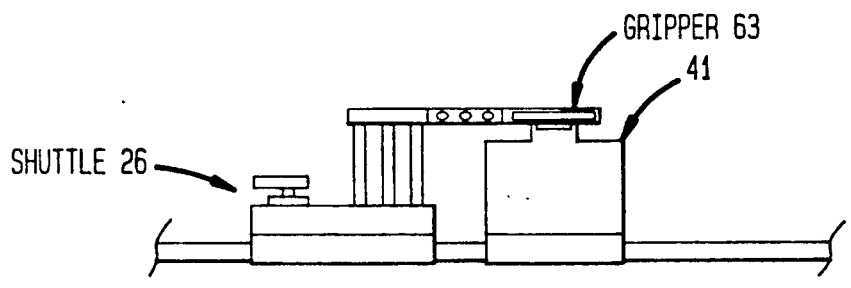
Figure 8:
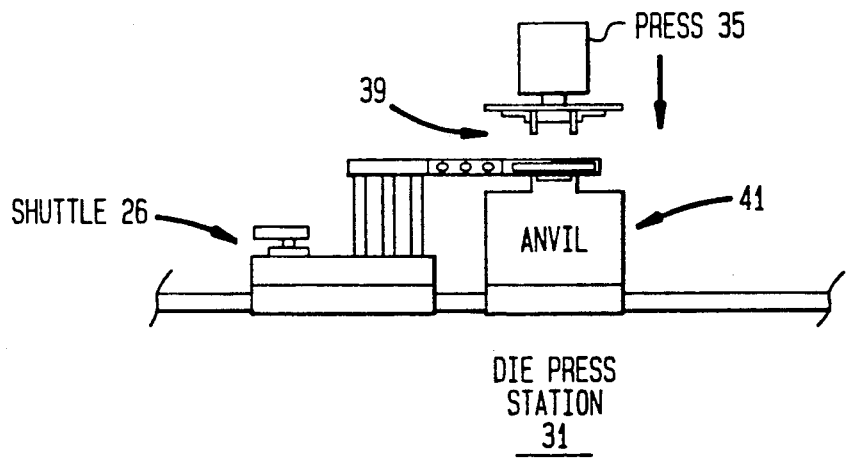

With an individual carrier 13 that has been extracted from the bottom of the stack now captured by carrier gripper 61, the carrier shuttle is translated by its drive air cylinder 45 along rail 28 to die press station 31, as shown in FIG. 5. When the shuttle reaches the die press station 31 (FIG. 6), the carrier gripper 61 is lowered onto anvil 41 (located directly beneath die press 35) such that a pair of vertical alignment posts on the anvil engage sprocket holes (or other similar tooling apertures) in the carrier and thereby properly align the part to be excised from the carrier with the anvil 41, as shown in FIG. 7.

With the part now positioned on the anvil 41 directly beneath the die press 35, the die press is translated vertically downward (FIG. 8) to sever the part from the carrier and form the leads of the severed part. At this time corner tie strips are also severed so as to completely excise the part from the carrier.

Figure 9:
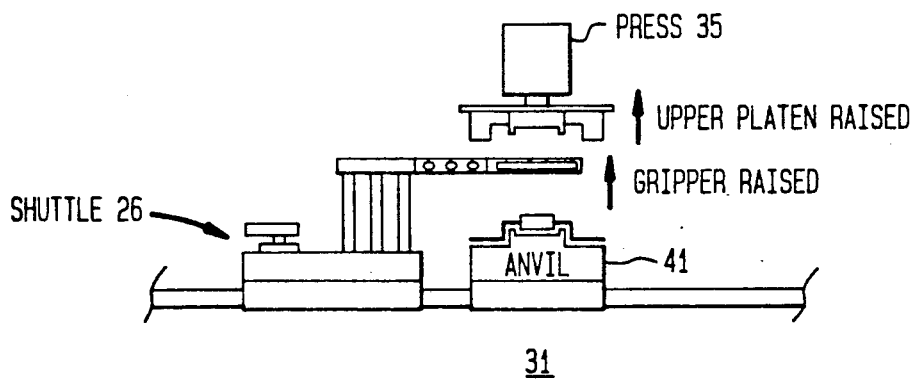
Figure 10:
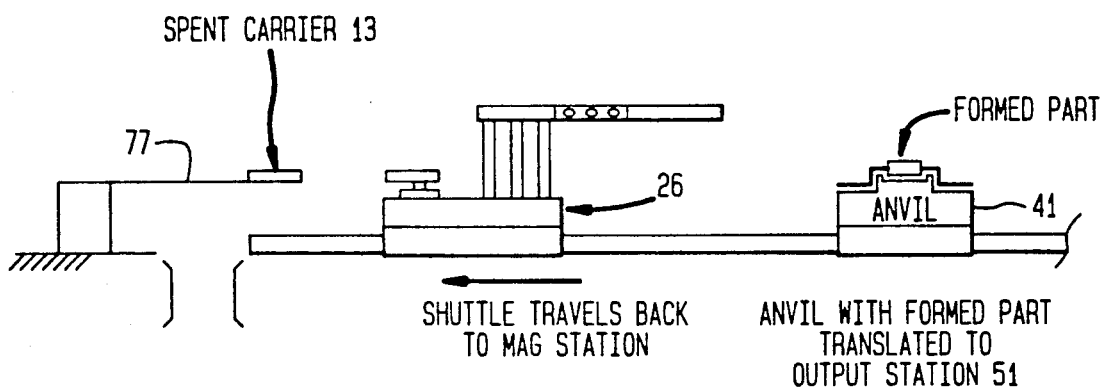

Next, as shown in FIG. 9, the lead forming die is retracted and the spent carrier is lifted off the anvil The shuttle carrier and the spent carrier are then translated back to the magazine station, as the anvil 41, which now carries the formed part, is simultaneously translated to the presentation station 51, where the part may be seized vertically by a pick-up device, such as a robot end-effector, as shown in FIG. 10.

With the anvil and the formed part translated to presentation station 51, an 'in position' signal is generated by controller 100, informing the host that the part is in position to be picked up. When a pick-up device is brought to the presentation station, the host transmits an EJECT signal to the controller which responds by activating an ejector device within the anvil beneath the formed part, so that the part may be readily seized by the pick-up device Should the host device attempt to initiate a new cycle without having transmitted an EJECT signal, the controller will generate an error flag, indicating that it still has a part to be picked up. With the part picked up, the anvil remains at output station 51 until another cycle begins, whereupon it is returned to the press station 31.

Figure 11:
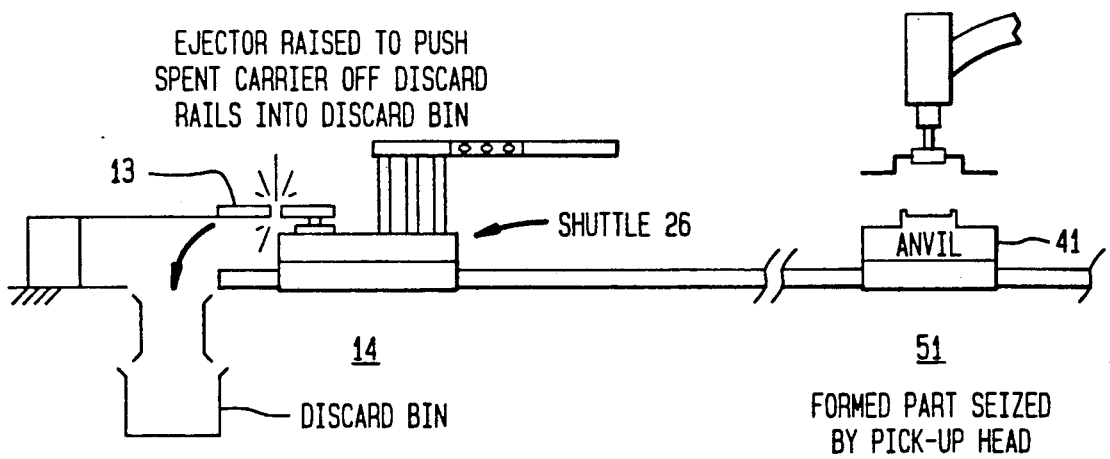

During the shuttle carrier's return to the magazine station 14, discard control air cylinder 73 is operated to raise push plate 75, so that it may engage and push a previously spent carrier (currently resting on rails 77) off the end of the rails and into an underlying spent carrier bin 49, as shown in FIG. 11, thus completing one carrier processing cycle. When the shuttle carrier returns to the magazine station, carrier gripper 61 is fully opened by means of a pneumatic actuator (to be described), causing the presently captured carrier from which a part has been excised to drop onto the discard rails 77, thus completing the cycle.

Once the spent carrier has been dropped from the shuttle onto the spent carrier rails 77, a new cycle begins, as the pneumatic force which fully opened the gripping fingers of the shuttle is released, allowing the gripper fingers to engage the aforementioned spreading wedge member, so as to impart a slight opening of the gripper fingers sufficient to allow a new carrier dropped from the magazine to be captured.

As will be described in detail below, a significant feature of the present invention is the manner in which carriers are delivered from the magazine by a mechanism which permits the carriers to drop off the bottom of the stack, one at the time, while retaining the remainder of the carriers within the stack. This vertical dropping of the bottom-most carrier away from the stack avoids the possibility of adjacent carriers hanging up on one another, as may occur if an attempt were made to slide an end carrier off the stack, as is done in conventional stacked carrier feed systems.

Figure 12:
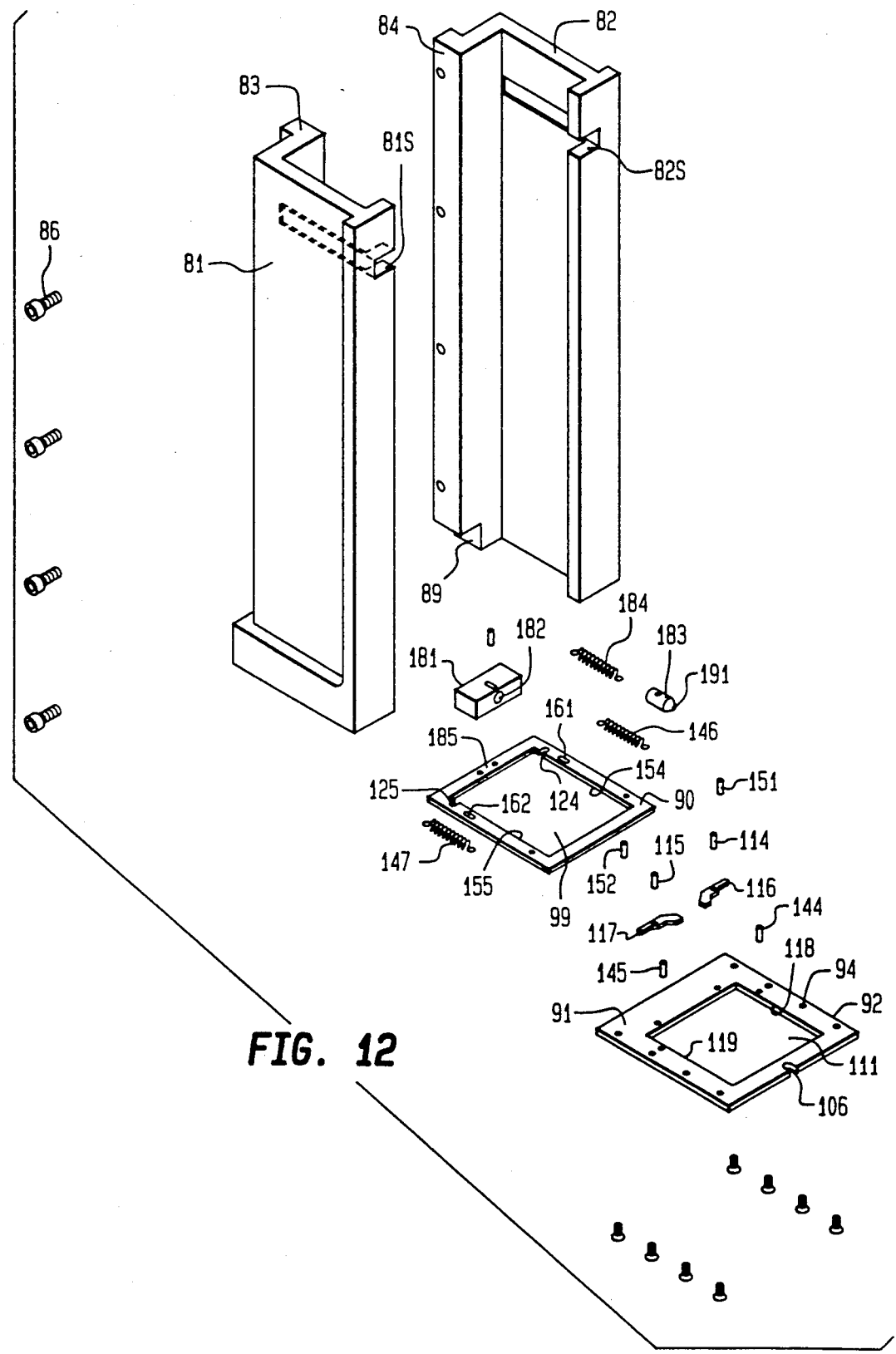
FIG. 12 diagrammatically illustrates an exploded view of the configuration of a carrier magazine and an associated carrier extraction unit.

FIG. 12 diagrammatically illustrates an exploded view of the configuration of magazine 11 and its associated carrier extraction unit 12, while FIGS. 13-19 are additional side and top views of portions of the magazine and the extraction unit that illustrate how the parts engage one another to allow only a single carrier at the bottom of the stack to drop away onto the shuttle. The magazine is comprised of a pair of vertically extending, generally mirror image, U-shaped wall units 81, 82 that are joined together along rear walls 83, 84, as by way of machine screws 86. The bottom of each of rear walls 83, 84 has a removed (and recessed) region 88 to allow for the horizontal translation of a slidable frame 90 over the top surface 91 of a fixed bottom frame 92 which has a set of holes 94 for bolting frame 92 to the bottom surface of wall units 81, 82. Similarly, an upper interior surface portion of each of wall units 81 and 82 may be provided with a recess or slot 81S, 82S to accommodate opposite sides of the cover flange of a the shipping box (not shown) in which carriers are supplied by a carrier vendor. Namely, slots 81S, 82S facilitate the mating of the top, open end of the magazine directly with the shipping box, so that the carriers in the shipping box may be readily stacked in the magazine, as is, from the shipping box. To load the magazine directly from the shipping box, the magazine is inverted and slipped over the flanges at the cover of the shipping box, so that the box and the magazine are mutually vertically aligned as an integral unit. The magazine is then inverted to allow the stack of carriers in the shipping box to pass into the magazine, and the magazine base is mounted to the feeder housing.

Figure 13:
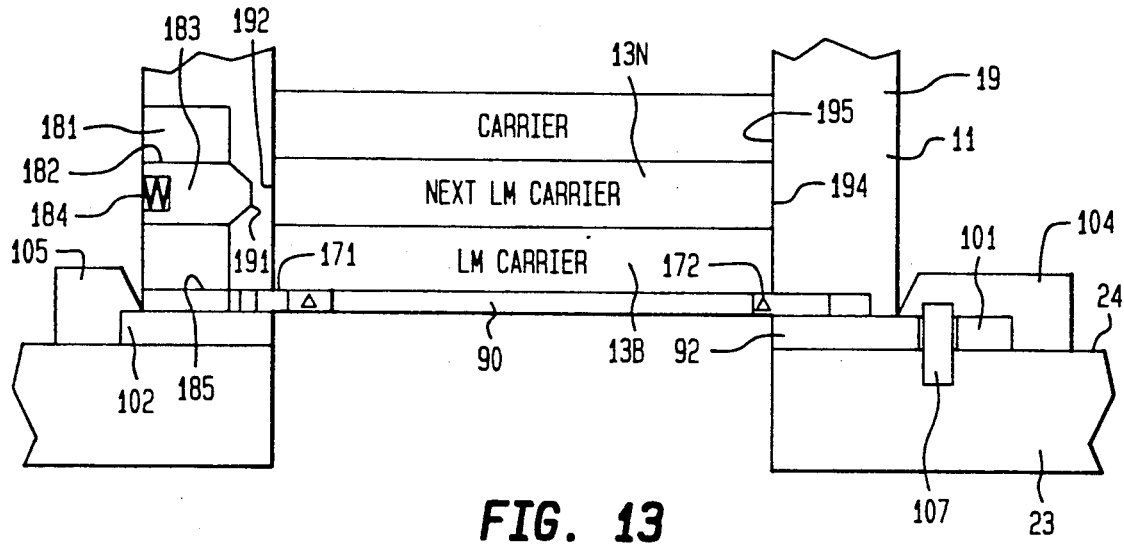
FIGS. 13-19 are additional side and top views of portions of the magazine and the extraction unit that illustrate how the parts engage one another to allow only a single carrier at the bottom of the stack to drop away onto the shuttle.

Bottom frame 92 is slightly longer than the depth of the wall units so that it extends just beyond the bottom edge of each wall unit, as shown at 101, 102 in FIG. 13, thereby allowing the magazine to be rigidly affixed to the housing by a pair of chamfered clamps 104, 105, respectively mounted to the top surface 24 of housing top plate 23. Generally centrally located at edge portion 101 of bottom frame 92 is a detent 106 which engages an alignment pin 107 in top plate 23 of the housing, thereby aligning the magazine above aperture 22. Clamp 104 is fixed, while clamp 105 is manually translatable by means of a grip handle 106 and incorporates an internal spring (not shown) to bias the clamp toward aperture 22. As the magazine is being, clamp 105 is urged back against its spring bias, so as to allow the bottom frame 92 to be seated flush against the top surface 24 of the top plate. The clamp then returns to its biased-closed position, so as to secure edge 102 of frame 92 in place.

Figure 14:
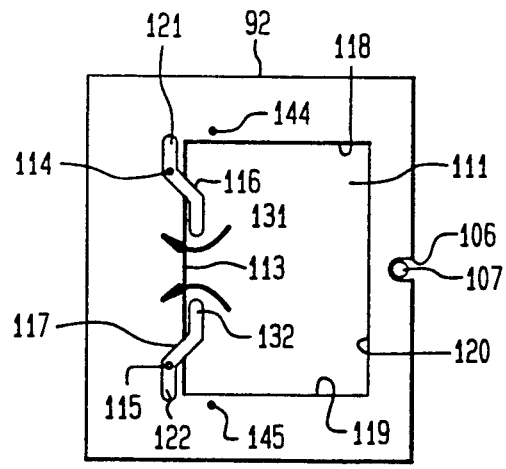

Bottom frame 92 has an aperture or 'drop slot' 111 sized in correspondence and aligned with the interior 16 of the magazine Adjacent to a rear edge 113 of aperture 111 are a pair of pins 114, 115 upon which respective generally S-shaped cam members 116, 117 are rotatably mounted, such that cam members 116, 117 are in the same plane as slidable frame 90 atop bottom frame 92 and have respective outer ends 121, 122 that engage detents 124, 125 in frame 90. Cam members 116, 117 have interior ends 131, 132 which are adapted to extend over aperture 111 of bottom frame 92 when the magazine is in its at rest or storage mode, as shown in FIG. 14. In this mode, all of the carriers that have been inserted into the magazine through the top opening 15 are securely retained in a stacked configuration.

Adjacent to side edges 118, 119 of drop slot 111 of bottom frame 92 are additional pins 144, 145 to which first ends of horizontally extending compression springs 146, 147 are connected. Second ends of these springs are connected to pins 151, 152 which are mounted adjacent to side edges 154, 156 of an aperture 99 in slidable frame 90. Pins 144, 145 pass through elongated slots 161, 162 in slidable frame 90, thereby causing extension springs 146, 147 to normally bias slidable frame toward rear walls 83, 84 of the magazine until pins 144, 145 in bottom frame 92 abut against ends 148, 149 of elongated slots 161, 162 of slidable frame 90, thereby delimiting relative movement between frames 90 and 92.

Figure 15:
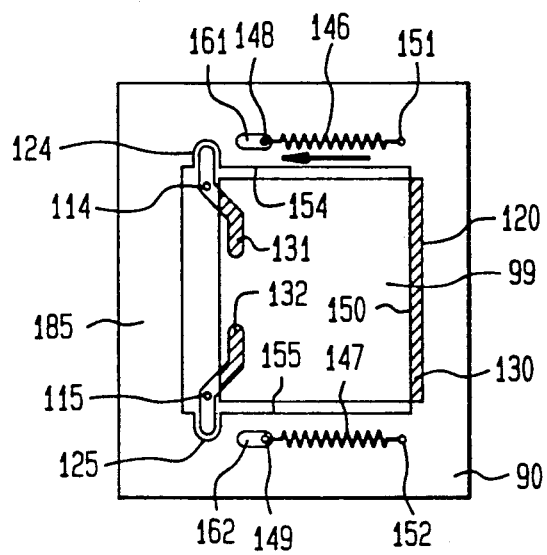

Aperture 99 of slidable frame 90 is sized as diagrammatically illustrated in FIG. 15, which shows the position of slidable frame 90 above bottom frame 92 for the storage mode of the magazine. With pins 144, 145 abutting against ends 148, 149 of elongated slots 161, 162 of frame 90, a forward edge 150 of slidable frame 90 slightly overlaps the forward edge 120 of bottom frame, by an overlap region 130 (e.g. on the order of an eighth of an inch). Also, for this relative position of frames 90 and 92, the outer ends 121, 122 of cam members 116, 117 are positioned by detents 124, 125 of slidable frame 90, such that the interior ends 131, 132 of cam members 116, 117 overlap the rear edge 113 of drop slot 111 in bottom frame 92. As a result, within the plane of slidable frame 90, overlap region 130 of frame 90 and interior ends 131, 132 of cam members 116, 117 effectively constrict the opening defined by the mutual overlap of aperture 99 of slidable frame 90 and aperture 111 of bottom frame 92, and provide support surfaces upon which opposite edges 171 and 172 of the bottom-most carrier 13B rests, as shown in the partial side view of the bottom of the magazine in FIG. 16.

Figure 16:
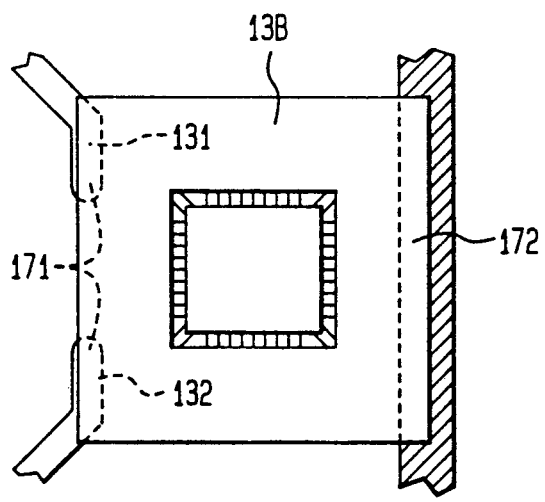

In accordance with the present invention, bottom-most carrier 13B is extracted from the stack by translating slidable plate 90 against the action of bias springs 146, 147 toward the endwall 19 of the magazine where window 17 is defined, namely to the right as viewed in FIGS. 15 and 16. For this purpose, a block 181 has a cylindrical bore 182 in a bore 182 of which a cylindrically shaped button or plunger 183 is retained against a spring seated at the bottom of the bore. Block 181 is mounted to a rear surface region 185 of slidable frame 90. Plunger 183 has a generally conically shaped nose portion 191 positioned and sized to engage the side surface 192 of the next-to-the-bottom carrier 13N, when frame 90 is urged to the right, as shown in FIG. 13. The opposite side surface 194 of carrier 13N is also urged into abutment with the interior surface 195 of magazine endwall 19 as slidable frame is so translated.

Figure 17:
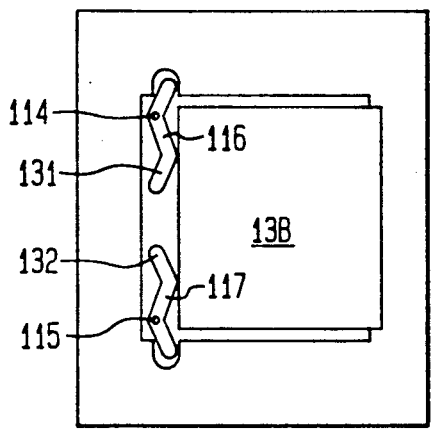
Figure 18:
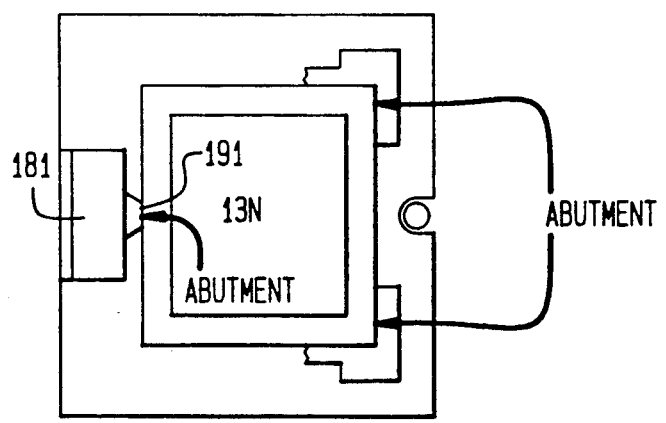
Figure 19:
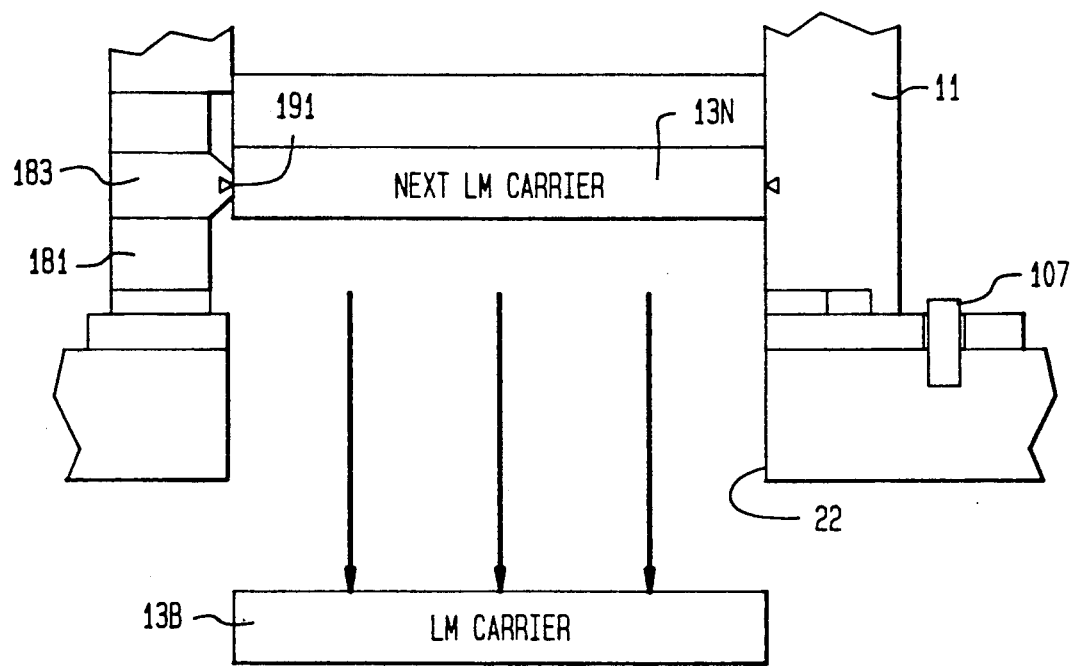
Figure 21:
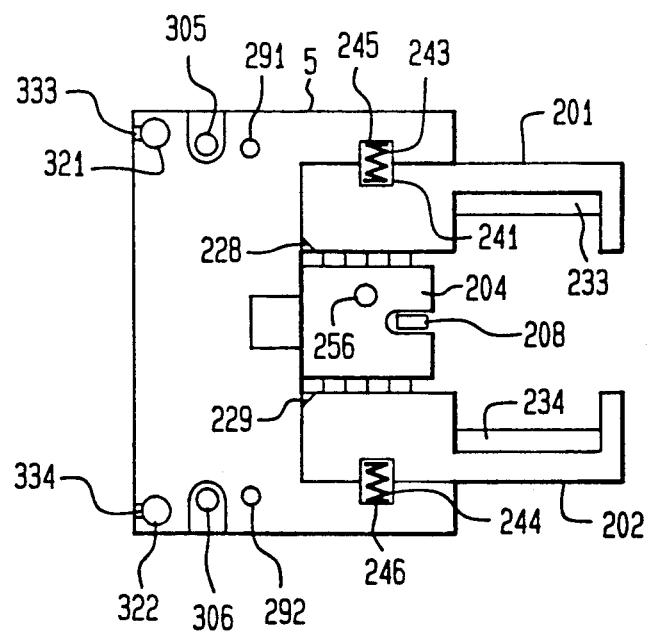
FIGS. 20-28 show the component parts and the overall configuration of a carrier gripper.

In order to extract the bottom-most carrier 13B from the stack, block 181 is displaced toward the interior of the magazine (to the right as viewed in the Figures), for example either mechanically or pneumatically, thereby translating slidable frame 90 against the biasing action of extension springs 146, 147. During this extraction mode of the magazine, the rightward translation of frame 90 causes cam member 116 to be rotated clockwise about pin 114 and cam member 117 to be rotated counterclockwise about pin 115, so that the interior ends 131, 132 of the cam members no longer overlap aperture 111 of bottom frame, as shown in FIG. 17. As also shown in FIG. 17, the translation of frame 90 displaces forward edge 150 of aperture 99, so that forward edge 150 of slidable frame 90 no longer overlaps forward edge 120 of bottom frame 92, thereby allowing bottom-most carrier 13B to drop free through aperture 22 in plate 23. As block 181 is pushed inwardly, the nose portion 191 of button 182 engages the side surface 192 of the next-to-the-bottom carrier 13N, as frame 90 is urged to the right, as shown in FIGS. 18 and 19, so that the opposite side surface 194 of carrier 13N is urged into abutment with the interior surface 195 of magazine endwall 19, thereby effectively jamming carrier 13N within the magazine and preventing it and the remaining carriers above it from dropping together with bottom-most carrier 13B. The spring bias of button 183 maintains the side force against carrier 13N as block 181 is allowed to return to its static condition position under the bias of extension springs 146, 147. As slidable frame moves back to its previous position, cams 116, 117 rotate back into their aperture-constricting orientations and forward edge 150 of frame 90 again overlaps edge 120 of aperture 111 of bottom frame 92. As block 183 and frame 90 continue their return movement to the static condition, button 183 separates from the side edge 192 of carrier 13N allowing carrier 13N and the remainder of the stack above it to drop onto cams 116, 117 and overlap region 130.

Figure 20:
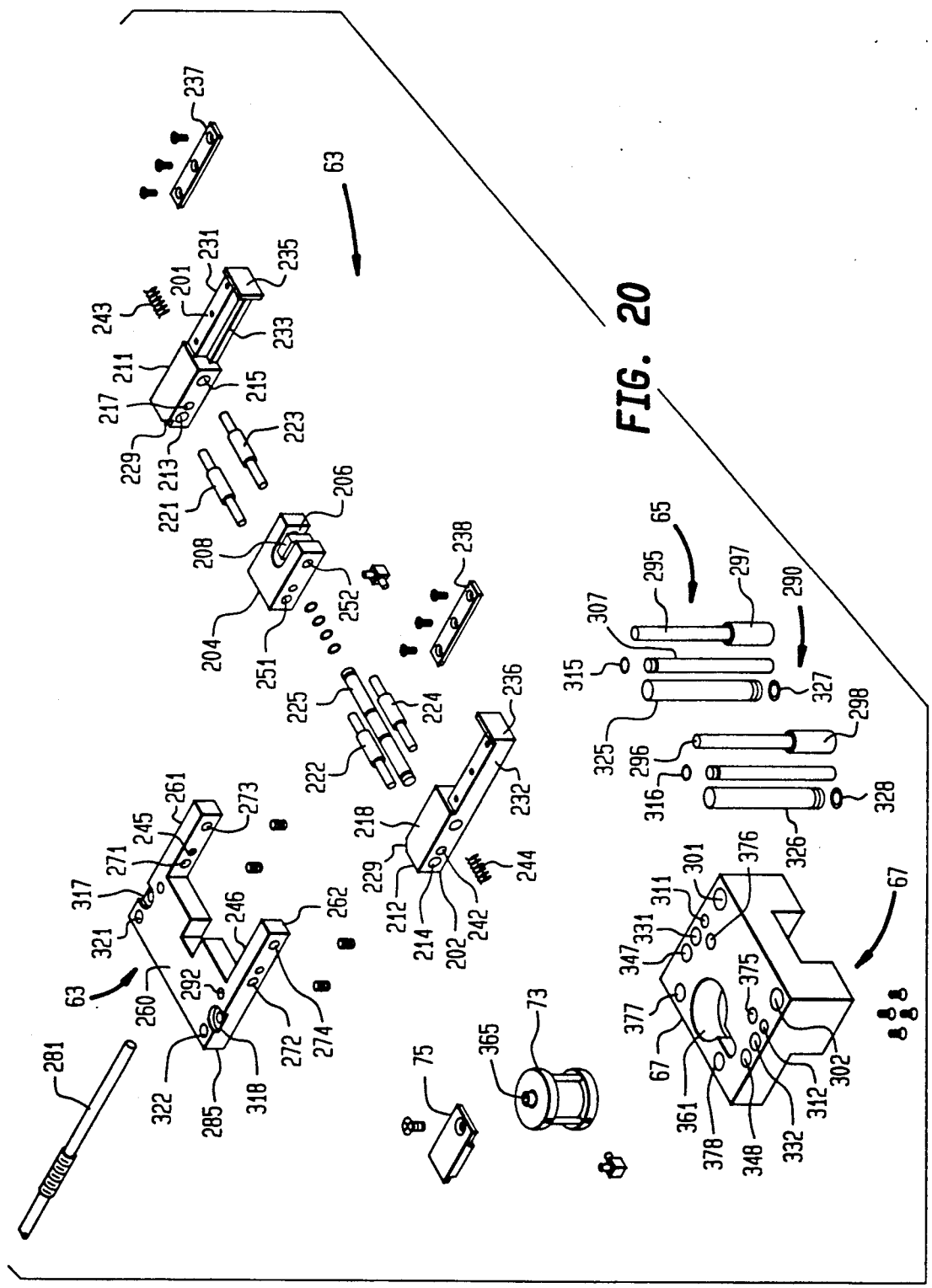
Figure 22:
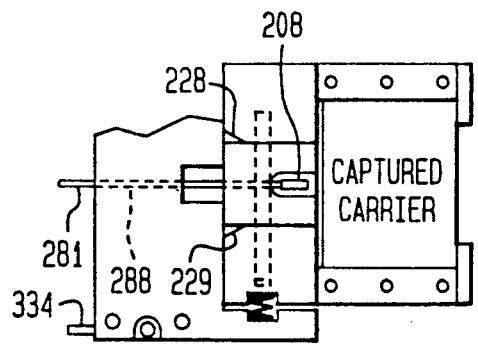
Figure 23:
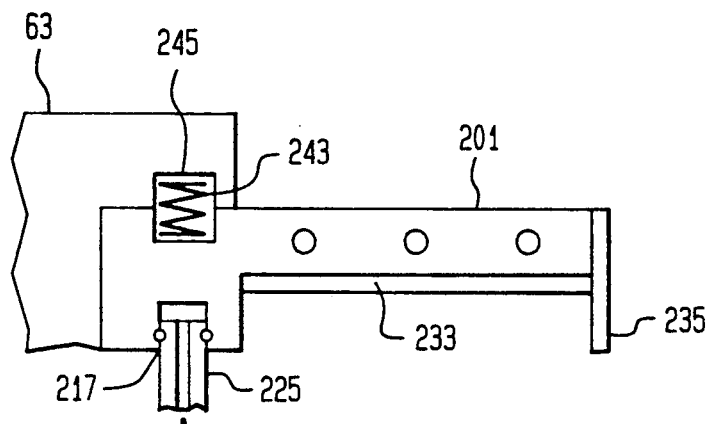

FIG. 20 diagrammatically illustrates an exploded view of the configuration of the shuttle 26, while FIGS. 21-24 are additional side, top and end views of portions of the shuttle illustrating how the parts of the shuttle engage one another to securely capture, retain and discard a carrier that has been delivered from the magazine. The carrier gripper, shown at 61 in FIG. 20, is comprised of a pair of horizontally oriented gripper fingers 201, 202 which are spaced apart from one another by a sensor block 204, in a forward cavity 206 of which a carrier sensor 208 (see FIG. 21) is retained. The carrier sensor includes a light emitting diode and an adjacent photodetector element oriented with respect to where a side edge of a carrier will be positioned when a carrier is captured by the gripper. Unless a carrier is present light from the LED will not be reflected onto the photodetector. However, when a carrier is present, light from the LED will be reflected off a side edge of the carrier and impinge upon the photodetector, causing it to generated an output signal, indicating the presence of a carrier.

Gripper finger 201 has a base 211, through which bores 213, 215, are drilled for accommodating centrally located bushings of guide shafts 221, 223, while a third bore 217 receives a first end of a pneumatic supply rod 225. Bores 213, 215 extend completely through base 211, while bore 217 extends only partially into the base. A rear interior top corner 228 of base 211 is chamfered to engage a spreading wedge mounted to the bottom of top plate 23 of the housing for the purpose of imparting a prescribed separation of gripper finger 201 from sensor block 204 when the carrier gripper is positioned at the magazine station in preparation for receiving an extracted carrier. Extending from base 211 is a bar portion 231 having a ledge 233 and terminating at a forward wall 235. An overhang plate 237, which partially overhangs ledge 233 is mounted atop bar portion 231. Similarly, gripper finger 202 has a base 212, through which bores 214, 216, are drilled for accommodating centrally located bushings of guide shafts 222, 224, while a third bore 218, aligned with bore 217 in base 211, receives a second end of a pneumatic supply rod 225. Bores 214, 216 extend completely through base 212, while bore 218 extends only partially into base 212. A rear interior top corner 229 of base 212 is chamfered to engage the spreading wedge mounted to the bottom of top plate 23 of the housing for the purpose of imparting a prescribed separation of gripper finger 202 from sensor block 204 when the carrier gripper is positioned at the magazine station in preparation for receiving an extracted carrier.

Extending from base 212 is a bar portion 232 having a ledge 234 and terminating at a forward wall 236. An overhang plate 238, which partially overhangs ledge 234 is mounted atop bar portion 232. The overhang plates are of sufficient width to allow a carrier to drop onto and be supported by ledges 233 and 234, for a first degree of separation of the gripper fingers, and then provide a partial overhang of edges of an extracted carrier when the separation between the gripper fingers has been reduced to prevent canting or tilting of a carrier from its horizontal orientation, particularly during downward translation of the gripper to bring the carrier into registration with alignment posts on the anvil. In addition, respective topside edges 239, 240 of the overhang plates are chamfered to assist in guiding a dropped carrier into position on the underlying ledges 233, 234.

Bases 211, 212 further include respective partial bores 241, 242, which receive bias springs 243, 244 that are seated in associated bores 245, 246 in a generally U-shaped gripper support block 63. Bias springs 243, 244 serve to bias gripper fingers 201, 202 toward each other to a 'closed finger' configuration, shown in FIG. 22. In their closed configuration, the gripper fingers are spaced apart slightly wider than the width of a carrier so as to provide a very slight amount of play on the ledges, which serves to facilitate registration of the tape during its placement upon the anvil, as will be described below.

Sensor block 204 has bores 251, 252 for receiving first ends of guide shafts 221, 223 and first ends of guide shafts 222, 224. Block 204 also has a bore 254 through which pneumatic supply rod 225 passes and a pneumatic supply port 256 for connecting an air supply to pneumatic supply rod 225 Opposite ends of rod 225 are recessed to receive O-rings for sealing the ends of rod 225. As a consequence, when air is supplied via supply port 256 to and exits opposite ends of rod 225, the seal provided by the O-rings causes pressure to be exerted against the interior ends of partial bores 217 and 218, thereby imparting a separation force against the bias of the springs, as diagrammatically illustrated within bore 217 of gripper finger 210 shown in FIG. 23. This pneumatically supplied separation force is employed to fully open the gripper fingers (against the interior sidewalls of gripper support 63) and allow a previously captured carrier to drop free onto the carrier discard rails.

U-shaped gripper support block 63 has first and second spaced apart legs 261, 262 which extend horizontally from a base portion 260. Interior sidewalls surfaces 264, 265 of the legs have bores 245, 246 against which closure bias springs 243, 244 are seated, as described above. Leg 261 has bores 271, 273 aligned with bores 213, 215 in base 211 for receiving second ends of guide shafts 221, 223. Similarly, leg 262 has bores 272, 274 aligned with bores 214, 216 in base 212 for receiving second ends of guide shafts 222, 224. Base portion 260 of support block 63 has a recess 277 for accommodating a bend in a sensor communication line, in particular an optical fiber 281, which passes through a bore 283 that extends from the rear surface 285 of base 260 to the recess 277.

Figure 24:
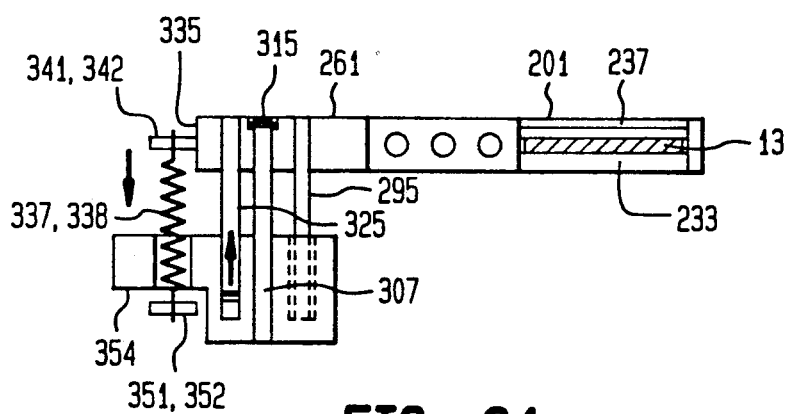

Gripper support block 63 is mounted by way of a set of vertical posts 290 for vertical displacement with respect to shuttle base block 67. Specifically, gripper support 63 has a first pair of bores 291, 292 which are sized to accommodate vertical guide posts 295, 296 which are supported by linear ball bushings 298, 299 in bores 301, 302 of shuttle base block 67. Gripper support 63 further includes a second pair of bores 305, 306, which are sized to accommodate guide posts 307, 308 which are captured in bores 311, 312 of shuttle base block 67. The upper ends of guide posts 307, 308 have retaining rings 315, 316 which are sized to engage respective recesses 317, 318 of carrier gripper support block and thereby the height of vertical travel of gripper support 63 above base block 67. Gripper support 63 also has a third pair of bores 321, 322 into which upper ends of a pair of vertical displacement control rods 325, 326 are press fit. The lower ends of rods 325, 326 have O-rings 327, 328 to provide a pneumatic seal with the sidewalls of a pair of bores 331, 332 in shuttle base block 67. Bores 331, 332 are ported to pneumatic supply lines 333, 334. The application of a controlled air supply to lines 333, 334 exerts a lifting force to the bottom surfaces of rods 325, 326, thereby displacing gripper support 63 upwardly until retaining rings 315, 316 come in contact with recesses 317, 318, thereby limiting the vertical travel of gripper support above carrier gripper support block 67. As shown in FIG. 24, this lifting force overcomes a normal downward bias supplied by extension springs 337, 338 top ends of which are mounted to support rungs 341, 342 mounted at the rear surface of gripper support block 63 and lower ends of which pass through apertures 347, 348 in base block 67 and are secured by bars 351, 352 against the bottom surface 354 of the base block. Consequently, gripper support block 63 is normally biased downwardly by springs 337, 338, with the spacing between gripper support block 63 and shuttle base block 67 being defined by the height of rods 325, 326 the lower ends of which become seated against the bottoms of bores 331, 332 in shuttle base block 67.

Shuttle base block 67 further includes a generally cylindrical recess 361 sized to accommodate a vertically positioned spent carrier discard air cylinder 73. Cylinder 73 has an output shaft 365 to which push plate 75 is mounted. As described previously, during the shuttle carrier's return to the magazine station from the die press station, cylinder 73 is operated, so that push plate 75 will be raised to engage a spent carrier (if present) resting on the discard rails Shuttle base block 67 may be mounted to an underlying carriage block (not shown) by means of a set of screws passing through a set of four mounting holes 375-378.

Figure 25:
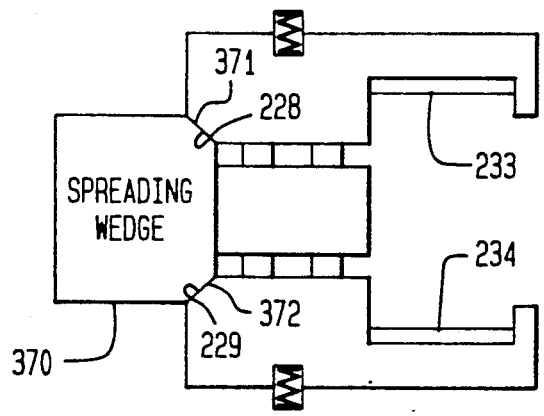
Figure 26:
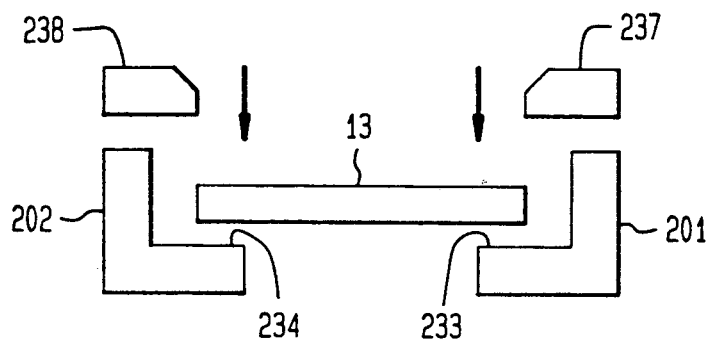

The manner in which the carrier gripper components of the carrier shuttle operate to capture, transport and release a carrier is diagrammatically illustrated in FIGS. 25-28. In particular, FIG. 25 shows a top view of the carrier gripper at magazine station 14, with air supplied to bores 331, 332 of base block 67, so that rods 325, 326 lift the carrier gripper to its carrier-receiving position directly beneath the magazine. In this position, the chamfered corners 228, 229 of gripper fingers 201, 202 engage the corners 371, 372 of a spreading wedge 370, so as to impart a slight separation of gripper fingers 201, 202 from the sides of sensor block 204. This separation (e.g. on the order of 50 mils) is sufficient to allow a carrier 13 to pass between the interior edges of overhang plates and come to rest upon ledges 233 and 234 of gripper fingers 201, 202, as shown in FIG. 26.

When an extracted carrier has dropped from the bottom of the magazine onto the shuttle, sensor 208 light from the LED in the sensor 208 is reflected off a side edge of the carrier received by an adjacent photosensor device of the sensor, which generates an output signal indicating that a carrier has been captured an therefore the shuttle may be translated to the die press station.

Figure 27:
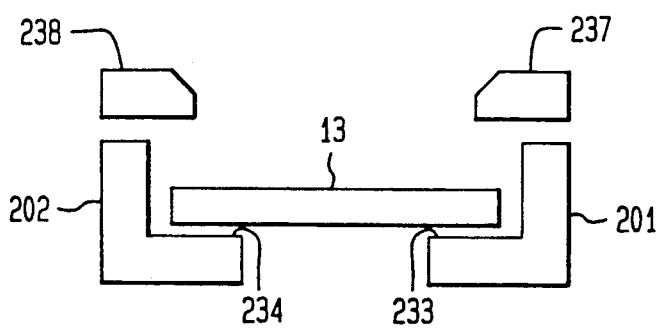

When the shuttle carrier leaves the magazine station, the gripper fingers no longer engage spreading wedge, so that the closing action of bias springs 243, 244 urges the gripper fingers against the sides of the sensor block 204. In this 'closed' position overhang plates 237, 238 now extend partially above the edges of the carrier, as shown in FIG. 27, delimiting vertical movement of the carrier in its captured condition.

As the shuttle is translated along rail 28 to the die press station, a (magnetic) position sensor (not shown) on the shuttle traverse air cylinder 33 detects when the piston is adjacent to the detector and thereby the shuttle has arrived at the die press station, with the gripper now located directly over the anvil and beneath the die press. The pneumatic supply to bores 331, 332 is then controllably exhausted, so that the gripper support block is gradually lowered by the biasing action of springs 337, 338. As the carrier is lowered onto the anvil, sprocket holes in the carrier are engaged by corresponding alignment posts on the anvil.

Because of the overhang plates, the carrier is prevented from being tilted 'off axis' and becoming 'hung up' on the anvil. As a consequence, if there is a slight misregistration of the sprocket holes and the vertical alignment pins as the carrier gripper is lowered onto the anvil, the overhang plate imparts a horizontal bias to the carrier. This horizontal urging of the carrier brings the tape into registration with the alignment posts of the anvil, whereby the part is accurately registered on the die anvil.

After the part has been excised from the carrier, with its leads formed by the downward motion of the die press, the die press is lifted vertically out of the way to allow the shuttle to raise the spent carrier off the anvil. Air is again supplied to bores 331, 332 lifting rods 325, 326 and raising the gripper support. The shuttle is then translated back to the magazine station as the die anvil is present forward to the output station 51.

As the shuttle approaches the magazine station, cylinder 73 is energized to raise push plate 75 slightly above the height of the discard rails. Should a previously discarded carrier be resting on the rails it will be pushed off by push plate 75 and fall through a discard aperture in the rear of the housing base plate and into the discard bin.

Figure 28:
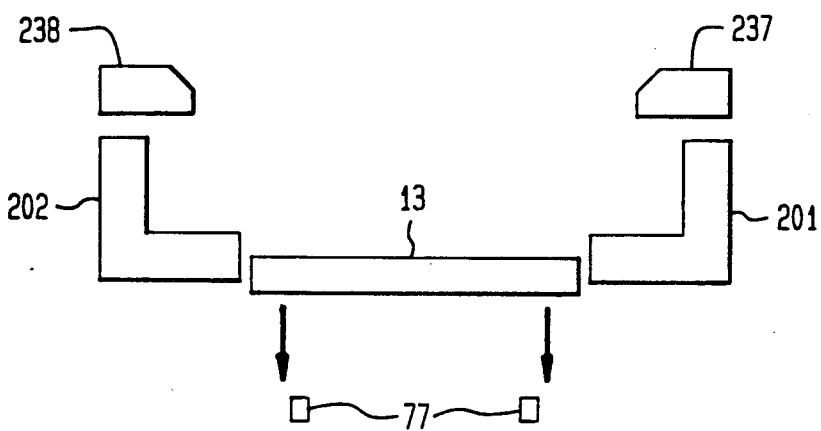
Figure 29:
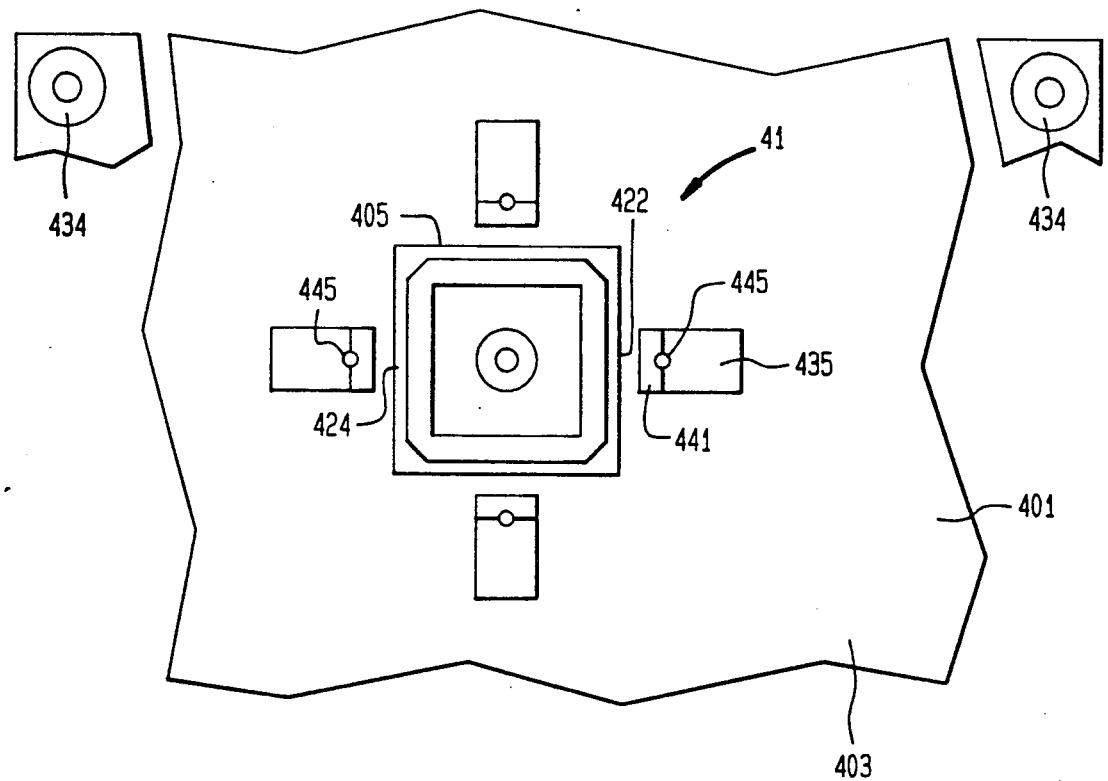
FIGS. 29 and 30 are respective diagrammatic top and partial side views of a translatable anvil.
Figure 30:
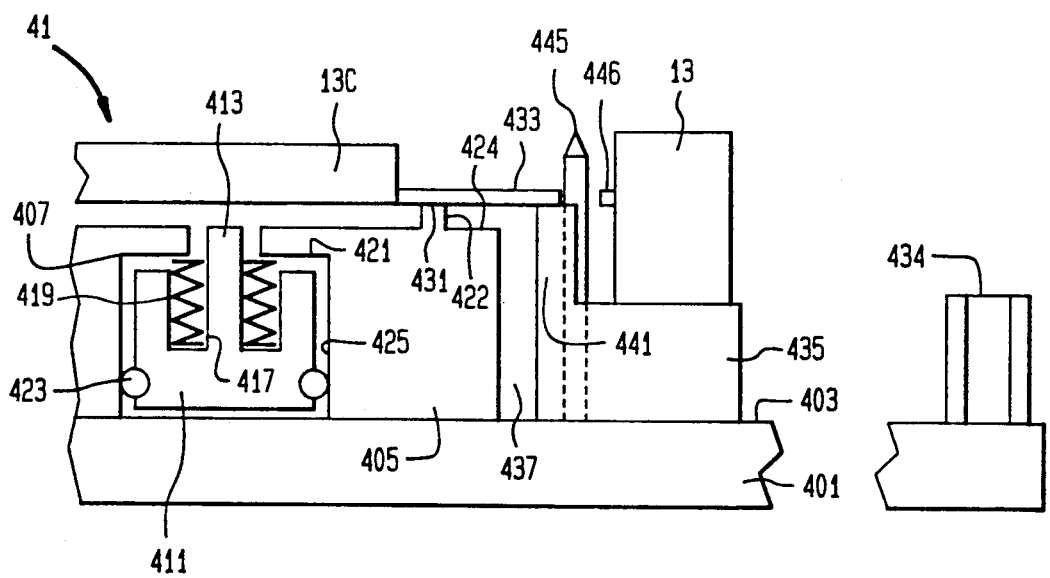

When the shuttle arrives at the magazine station, air is supplied through port 256 in sensor block 204, so that gripper fingers 201, 202 are urged into their fully open state. As shown in FIG. 28, the separation between fully open gripper fingers 201, 202 is now sufficient to allow the spent carrier 13 to drop past ledges 233 and 234 onto the discard carrier rails 77. With the spent carrier now discarded, the air supply to port 256 is terminated, whereby bias springs 243, 244 urge the gripper fingers together, so that they close upon spreading wedge 370 and are thereby properly spaced apart from one another, in the manner shown in FIG. 25 and 26, for receiving and capturing a newly delivered carrier.

Referring now to FIGS. 29-32, the configuration of the press station 31 comprised of a press-driven lead-clamping, forming and severing unit 39 and an associated translatable anvil 41 will be described. As shown in the top view of FIG. 29 and the partial side view of FIG. 30, translatable anvil 41 comprises a lower platen 401, to the top surface of which a generally square shaped anvil block 405 is affixed. Anvil block 405 has a stepped cylindrical bore 407 sized to accommodate an ejector button 411 having a reduced diameter solid central stem portion 413 and a surrounding wider diameter body portion 415. Body portion 415 has a deep annular groove 417 which receive a compression spring 419. Compression spring 419, when seated within annular groove 417 is captured between the bottom of the groove and upper surface 421 of stepped cylindrical bore 407, so as to urge ejector button 411 downwardly, and out of the way of a circuit component 13C of carrier 13. Ejector button 411 also retains an O-ring 423 sized to form a seal with the interior sidewall 425 of bore 407. The lower portion of bore 407 is ported to a pneumatic supply through which air is supplied to the bore for controllably urging ejector button 411 upwardly against the downward bias of spring 419, whereby stem portion 413 comes into contact with the bottom of the part and lifts the part, so that it may be removed.

Anvil block 405 has a raised clamping surface region 431 upon which the leads 433 of the part rest when the carrier 13 is lowered into registration on the anvil. Adjacent to clamping surface region 431 are lead forming surfaces 422, 424. Mounted on lower platen 401 in spaced apart relationship to anvil block 405, so as to leave a gap 437 therebetween, is a set of four generally L-shaped outer support blocks 435. Each outer support block 435 has a lead support rail 441 and a slot 443 through which a vertical alignment post or pin 445 may extend. In an actual embodiment two support blocks 435 on opposite sides of anvil block 405 are provided with vertical alignment pins 435.

Also affixed to lower platen 401 are a pair of journalled vertical bushings 434 into which a pair of associated precision fit guide posts on an upper platen pass, when the die press lowers the upper platen onto the die anvil in the course of clamping, excising and forming the leads of a part.

As noted above, as the carrier is lowered onto the anvil, a respective sprocket hole 446 in the carrier is engaged by alignment post 445 and, because of the provision of overhang plates on the carrier gripper fingers, the carrier is prevented from being tilted or canted and becoming 'hung up' on the anvil. The slight amount of horizontal play on the support ledges of the gripper fingers enables the overhang plates to urge the carrier sideways to the extent necessary to bring the carrier into alignment with posts 445, so that the carrier is accurately registered on the anvil.

Figure 31:
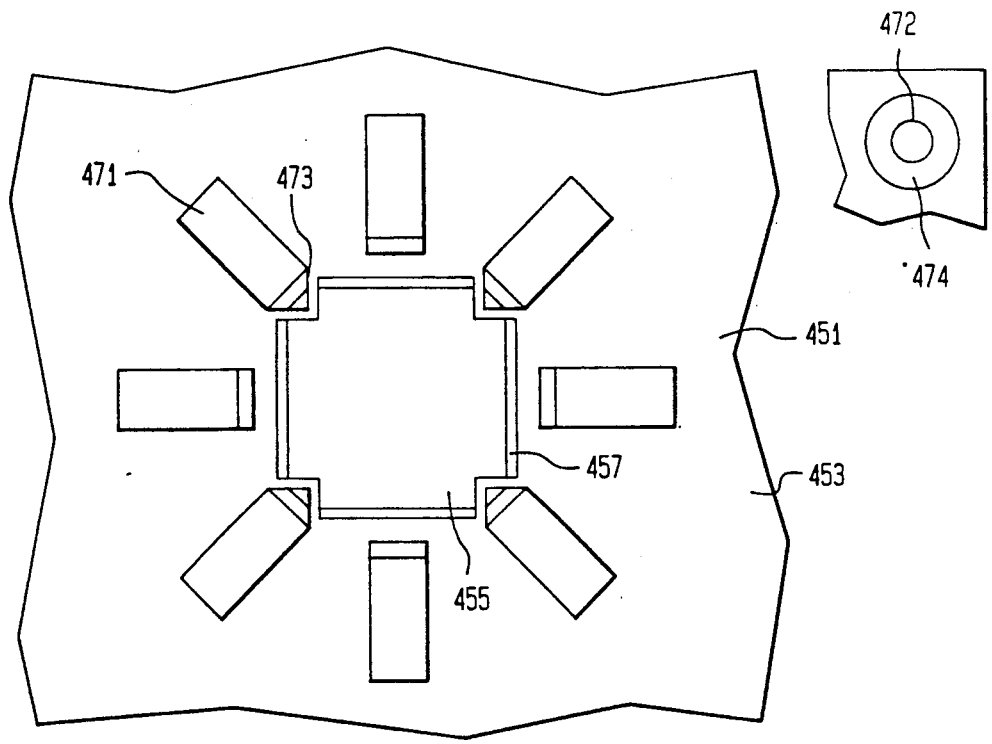
FIGS. 31 and 32 are respective diagrammatic plan and partial side views of a lead clamping, excising and forming unit.
Figure 32:
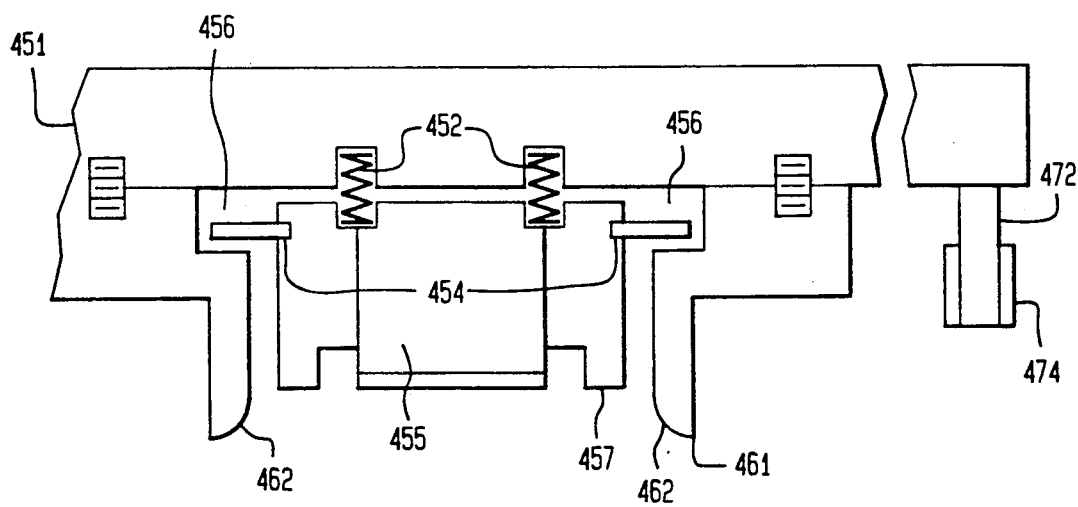

Lead clamping, excising and forming unit 39 is shown in the diagrammatic plan view of FIG. 31 and the partial side view of FIG. 32 as comprising an upper platen 451 upon the lower surface 453 of which a floating clamping block 455 is mounted. Floating clamping block 455 is supported against compression springs 452 which are captured in recesses in clamping block 455 and upper platen 451. Clamping block guide pins 454 extend into recesses 456 in lead forming and severing blocks 461, which are rigidly attached to upper platen 451 adjacent to clamping block 455. The lower ends 462 of lead forming and severing blocks 461 are contoured to shape the excised leads of the part as they bend the leads downwardly and cause the bent lead to bottom out against the lead forming surfaces 422 and 424 of anvil block 405.

Upper platen 451 and the lead forming components it supports are mounted solid with the output shaft of the press, so that there is no mutual translational movement among the forming and excising parts, thereby assuring precision forming and severing of the extremely fine tolerance leads, something which would not be possible using a conventional floating anvil system, where play among the forming parts is afforded. Because of the integral (solid) mounting of the forming parts with the upper platen, precision control of the forming force is necessary. For this purpose the downward pressure applied by the press is controlled by an adjustable pressure regulator, so that a precise forming force will be imparted to the free ends of the clamped leads.

Clamping block 455 contains a set of four raised annular clamping edges 457 each of which is sized to form alignment with clamping surface regions 431 of anvil block 405 when anvil 41 is brought into vertical registration with press 35 at press station 31. Mounted on upper platen 451 adjacent to clamping block 455 is a set of four lead forming and severing blocks 461, positioned to engage the free ends of leads 433, and bend those free ends against forming surfaces 422, 424 of anvil block 405. An outer corner 463 of each block 461 has a sharp severing edge for cutting the formed leads. Also mounted on upper platen 451 adjacent to clamping block 455 is a set of tie strip severing blocks 471, positioned to engage diagonally extending support tie strips located at the corners of the carrier and its supported component. An inner corner 473 of each tie strip severing block 471 has a sharp severing edge for cutting the diagonal tie strips.

To provide precision alignment of the upper platen-mounted components of the lead clamping, excising and forming unit 39 with the die anvil 41, upper platen 451 has a pair of guide posts 472 at the lower ends of which respective ball bushings 474 are provided. Guide posts 472 are positioned on upper platen 451, so as to be in precision alignment with journalled vertical bushings 434 on lower platen 401. As the die press controllably lowers upper platen 451 toward lower platen 401, ball bushings 474 enter journalled bushings 434, with zero clearance (without play), so that there is no horizontal translation of the die anvil relative to the upper die excising and forming components.

Figure 33:
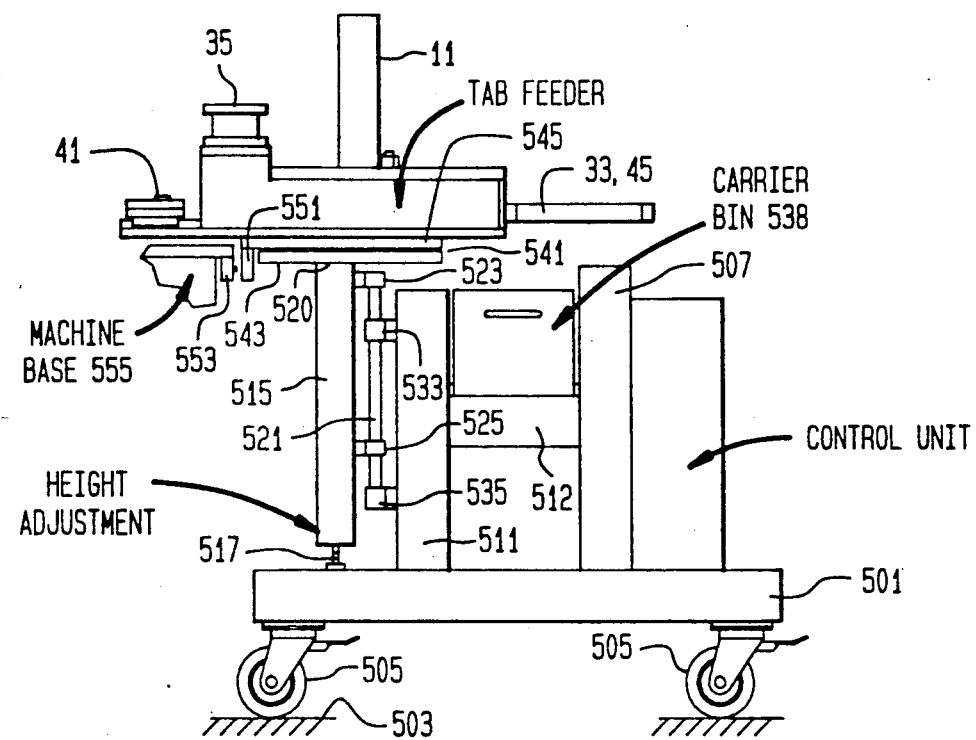
FIG. 33 is a diagrammatic side view of a transport unit for a tape automated bonding feeder apparatus of the present invention.

Referring to FIG. 33, a diagrammatic side view of a transport cart for supporting and transporting the above described tape automated bonding feeder apparatus is shown as comprising a base frame 501 supported for rolling movement upon a floor surface 503 by way of a set of castors 505. A generally H-shaped support frame 507 having vertical post members 511, 512 and a horizontal beam 512 is affixed to the base frame 501. A vertical support frame 515 having a threaded height adjustment foot screw 517 at its lower end 519 is mounted to post member 511 of frame 507 by way of a vertical guide shaft member 521 which passes through support blocks 523, 525 on frame 515 and associated support blocks 533, 535 on post member 511. Vertical guide shaft member 521 permits the height of frame 515 to be vertically adjusted with respect to base 501. A carrier receptacle 538 is supported by support frame 507 beneath the location of the feeder where spent carriers are discarded.

A feeder mounting plate unit 541 which provides a support base for the feeder is affixed to an upper end 520 of frame 515. The mounting plate unit includes a lower plate 543 and a leveling plate 545 mounted atop lower plate 543 by a set of leveling screws (not shown). The feeder itself is mounted on leveling plate 545. One or more alignment elements 551, in the form of side extending threaded guide rods, are affixed to the mounting plate unit, and are arranged to engage associated alignment elements 553 mounted to a circuitboard-assembly workbase 555 whereat parts removed from the feeder are processed.

With the height of the feeder mounting plate adjusted for a particular workbase, an operator brings the feeder transport unit up to the side of the workbase so that the guide rods engage associated alignment elements (e.g. recesses in alignment plates on the side of the workbase). Because the guide rods are threaded, the distance by which they extend from the side of the transport unit may be adjusted to obtain precision spacing between the location of the feeder and the workbase. It should be noted that the width of the transport unit (in the direction into the drawing) is typically large enough to accommodate a plurality of feeders that are mounted to the top plate of the transport unit in a side by side arrangement to enable the pick and place unit of the assembly apparatus ready access to a plurality of different circuit part types.

Figure 34:
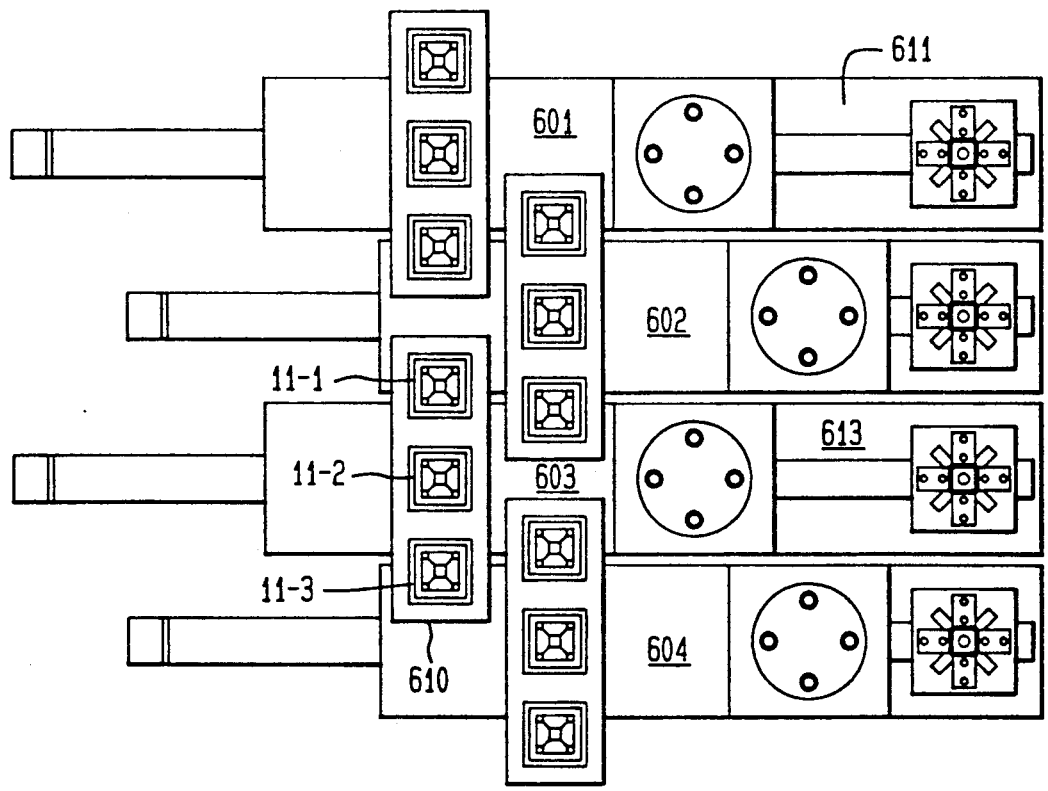
FIG. 34 shows a multiple magazine embodiment of the feeder apparatus of the present invention.

This multiple type part feed and form capability may be significantly enhanced in accordance with a second embodiment of the feeder, which has a multiple magazine configuration, a top view of which is diagrammatically shown in FIG. 34. In particular FIG. 34 shows an arrangement of plural (different length) feeders (four in the illustrated example) 601, 602, 603, 604 are arranged in a side by side layout on the top of the transport unit. The locations of the magazines of adjacent feeders are offset from one another so as to permit each feeder to accommodate multiple magazines that are translatable orthogonal to the lengthwise dimension of the feeders and thereby allow a selected magazine to be controllably positioned over the carrier delivery opening in the top plate of the housing of a respective feeder.

In the illustrated example, each feeder accommodates three magazines 11-1, 11-2, 11-3 which are mounted on horizontally translatable plates 610 alternately offset for adjacent feeders thereby permitting plates 610 to be moved back and forth without mutual interference. The magazine support plates may be translated by a rack and pinion mechanism (not shown) or other conventional translation device, the control for which is supervised by microcontroller 100. It will be noted that in the present example feeders 601, 603 have extended bases 611, 613 to provide for alignment of each of the presentation stations alongside the workbase of the assembly unit.

As will be appreciated from the foregoing description, the present invention obviates the problems of conventional TAB feeder systems by a reduced hardware volume apparatus which successively feeds individual ones of a plurality of carrier-retained electronic circuit components to a pick and place device for placement and attachment to a circuit board without having to sideways translate the carriers of the stack, thereby preventing surface anomalies on the surfaces of adjacent carriers in the stack from impeding the feed process. Because the carriers can be extracted vertically from the magazine onto a carrier shuttle, and thereby readily delivered to a lead forming unit, the presentation of an excised and processed part to a board-assembly pick and place device is facilitated.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. An apparatus for successively supplying respective ones of a plurality of electronic circuit components to an output station from which a component is seized for placement and attachment to a circuit board comprising, in combination:

a housing;

a magazine, in which a plurality of circuit component carriers are arranged in a stacked configuration, mounted on said housing, said magazine having a carrier extraction unit at one end thereof which controllably allows an individual component carrier at one end of said stack to drop away from said stack;

a carrier shuttle, supported for movement between a first location of said housing beneath said one end of said magazine and a second location of said housing, said carrier shuttle receiving and supporting a carrier dropped from said magazine for placement on a lead forming unit at said second location of said housing;

a lead forming unit at said second location of said housing, said lead forming unit being arranged to separate a component from a component carrier delivered thereto by said shuttle and to form the leads of a separated component into a prescribed shape for mounting the separated component to a circuit board; and a component transport unit coupled to said lead forming unit and arranged to transport a separated component, the leads of which have been formed by said lead forming unit, to said output station.

2. An apparatus according to claim 1, wherein said lead forming unit comprises an upper lead-clamping, bending and cutting unit mounted at said second location of said housing, and a lead-forming anvil mounted to said component transport unit.

3. An apparatus according to claim 2, wherein said lead forming unit comprises an upper floating lead-clamp, and bending and cutting members rigidly mounted to a vertically displaceable member at said second location of said housing.

4. An apparatus according to claim 3, wherein said lead forming unit comprises a controllable press for controllably displacing said vertically displaceable member, to which said bending and cutting members are rigidly mounted, and thereby controlling the lead bending and cutting pressure imparted by said lead forming unit upon said advil.

5. An apparatus according to claim 2, wherein said component transport unit is arranged to transport said anvil between said second location of said housing and said output station.

6. An apparatus according to claim 5, wherein said carrier shuttle is configured to retain, in a generally loose fit, horizontal condition, a component carrier that has been dropped from said one end of said magazine.

7. An apparatus according to claim 6, wherein said carrier shuttle comprises support frame upon which first and second spaced apart retention members are mounted, said retention members being translatable with respect to each other and being arranged to support and retain edge portions of a carrier, while allowing a limited degree of horizontal play of a carrier retained thereby.

8. An apparatus according to claim 1, wherein said upper lead-clamping, bending and cutting unit has a zero-clearance alignment member arranged to engage a corresponding alignment element fixedly mounted with respect to said lead-forming anvil.

9. An apparatus according to claim 1, wherein said anvil includes an ejector element controllably urged into contact with a formed part that has been excised from a carrier, so as to lift the part off the anvil and facilitate its capture by a part seizure device at said output station.

10. An apparatus according to claim 1, wherein said lead forming unit being arranged to form the leads of a separated component into a gull-wing shape for surface-mounting the separated component to a circuit board.

11. An apparatus according to claim 1, wherein said carrier extraction unit includes a first controllable shutter unit which controllably opens to allow the lowermost component carrier within said magazine to drop therethrough to said shuttle and an adjacent carrier engaging unit which retains a next lowermost component carrier in place as said lowermost component carrier is allowed to drop away from said one end of said magazine and thereafter allows said next lowermost carrier to move into position as the lowermost component carrier within said magazine.

12. An apparatus according to claim 1, wherein said carrier shuttle is arranged to transport to, and release at a third location of said housing, a carrier from which a component has been separated.

13. An apparatus according to claim 12, wherein said output station is configured to allow vertical access to a part that has been transported to said output station by said component transport unit.

14. An apparatus according to claim 1, wherein said lead forming unit comprises a lead forming anvil translatable between said second location and said output station and a die press unit having a lead forming die controllably engageable with said lead forming anvil, so as to remove a component from a carrier that has been placed into registration on said anvil by said shuttle and form the leads of the removed component, and wherein the force exerted by said die upon leads of a part borne by a carrier registered on said anvil is externally controllable.

15. An apparatus according to claim 14, wherein said anvil includes at least one alignment pin oriented to engage carrier registration element of a carrier delivered by said shuttle to said second location whereat said die press is provided.

16. An apparatus according to claim 14, wherein said anvil further includes an ejector element controllably urged into contact with a formed part that has been excised from a carrier, so as to lift the part off the anvil and facilitate its capture by a part seizure device at said output station.

17. A method for successively supplying respective ones of a plurality of electronic circuit components to an output station from which a component is seized for placement and attachment to a circuit board comprising the steps of:
(a) stacking a plurality of component-containing carriers in a generally vertically oriented storage magazine;
(b) controllably causing an individual component carrier at the bottom of said stack to drop away from said stack onto a carrier shuttle, which is supported for movement between said magazine and a lead forming unit spaced apart from said magazine;
(c) translating said carrier shuttle to said lead forming unit and bringing the component borne by said carrier into engagement with said lead forming unit;
(d) causing said lead forming unit to separate a component from a component carrier delivered thereto by said shuttle and to form the leads of a separated component into a prescribed shape for mounting the separated component to a circuit board; and
(e) translating a separated component, the leads of which have been formed by said lead forming unit, to said output station.

18. A method according to claim 17, wherein said lead forming unit comprises an upper lead-clamping, bending and cutting unit mounted at said second location of said housing, and a lead-forming anvil mounted to said component transport unit, and wherein said component transport unit is arranged to transport said anvil to said output station.

19. A method according to claim 17, wherein step (b) comprises retaining an individual component carrier that has dropped away from said stack onto said carrier shuttle in a generally horizontal condition.

20. A method to claim 17, wherein step (b) comprises providing a carrier extraction unit at the bottom of said magazine, said carrier extraction unit including a first controllable shutter unit which controllably opens to allow the lowermost component carrier within said magazine to drop therethrough to said shuttle and an adjacent carrier engaging unit which retains a next lowermost component carrier in place as said lowermost component carrier is allowed to drop away from said one end of said magazine and thereafter allows said next lowermost carrier to move into position as the lowermost component carrier within said magazine.

21. An apparatus for successively supplying respective ones of a plurality of electronic circuit components to an output station from which a component is seized for placement and attachment to a circuit board comprising, in combination:
a housing having an aperture through which a component carrier may pass;
a plurality of magazines, in each of which a plurality of circuit component carriers are arranged in a stacked configuration, translatably mounted with respect to the aperture of said housing, each magazine having a carrier extraction unit at one end thereof which controllably allows an individual component carrier at one end of said stack to drop away from said stack through said aperture, when said each magazine is aligned over said aperture;
a carrier shuttle, supported for movement between a first location of said housing beneath said aperture and a second location of said housing, said carrier shuttle receiving and supporting a carrier dropped from said a magazine for placement on a lead forming unit at said second location of said housing;
a lead forming unit at said second location of said housing, said lead forming unit being arranged to separate a component from a component carrier delivered thereto by said shuttle and to form the leads of a separated component into a prescribed shape for mounting the separated component to a circuit board; and a component transport unit coupled to said lead forming unit and arranged to transport a separated component, the leads of which have been formed by said lead forming unit, to said output station.

22. An apparatus according to claim 21, wherein said lead forming unit comprises an upper lead-clamping, bending and cutting unit mounted at said second location of said housing, and a lead-forming anvil mounted to said component transport unit.

23. An apparatus according to claim 22, wherein said component transport unit is arranged to transport said anvil between said second location of said housing and said output station.

24. An apparatus according to claim 23, wherein said carrier shuttle is configured to retain, in a generally horizontal condition, a component carrier that has been dropped through said aperture.

25. An apparatus according to claim 21, wherein said carrier extraction unit includes a first controllable shutter unit which controllably opens to allow the lowermost component carrier within a magazine to drop therethrough to said shuttle and an adjacent carrier engaging unit which retains a next lowermost component carrier in place as said lowermost component carrier is allowed to drop away from said magazine through said aperture and thereafter allows said next lowermost carrier to move into position as the lowermost component carrier within said magazine.

26. An apparatus according to claim 25, wherein said carrier shuttle comprises support frame upon which first and second spaced apart retention members are mounted, said retention members being translatable with respect to each other and being arranged to support and retain edge portions of a carrier.

* * * * *